(12) United States Patent
Okada et al.

(10) Patent No.: US 8,912,431 B2
(45) Date of Patent: Dec. 16, 2014

(54) SOLAR CELL ELEMENT AND SOLAR CELL MODULE

(75) Inventors: Ken-ichi Okada, Higashiomi (JP);
Norikazu Nakatani, Higashiomi (JP);
Naoya Kobamoto, Higashiomi (JP);
Hiroshi Ueda, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 216 days.

(21) Appl. No.: 13/388,034

(22) PCT Filed: Sep. 29, 2010

(86) PCT No.: PCT/JP2010/066988
§ 371 (c)(1),
(2), (4) Date: Jan. 30, 2012

(87) PCT Pub. No.: WO2011/040489
PCT Pub. Date: Apr. 7, 2011

(65) Prior Publication Data
US 2012/0125397 A1   May 24, 2012

(30) Foreign Application Priority Data

Sep. 29, 2009 (JP) ................. 2009-224271
Jul. 30, 2010 (JP) ................. 2010-172358
Aug. 31, 2010 (JP) ................. 2010-193094

(51) Int. Cl.
*H01L 31/042* (2014.01)
*H01L 31/0352* (2006.01)
*H01L 31/0224* (2006.01)
*H01L 31/068* (2012.01)

(52) U.S. Cl.
CPC ...... *H01L 31/068* (2013.01); *H01L 31/035281* (2013.01); *H01L 31/022425* (2013.01); *Y02E 10/547* (2013.01)
USPC .......................................... 136/258; 136/261

(58) Field of Classification Search
CPC ... H01L 31/02; H01L 31/042; H01L 31/0224; H01L 31/02167; H01L 33/02; H01L 51/441; H01L 51/5203; H01L 51/0096; H01L 21/02428; Y02E 10/40; Y02E 10/549; Y02E 10/544; Y02E 10/543; Y02E 10/60
USPC ................... 136/244, 252, 258, 261
See application file for complete search history.

(56) References Cited

U.S. PATENT DOCUMENTS 4,521,794 A * 6/1985 Murase et al. ................. 257/63
4,543,444 A   9/1985 Rasch et al.
(Continued)

FOREIGN PATENT DOCUMENTS

CN         1057735 A    1/1992
JP         S59-207672 A  11/1984
(Continued)

OTHER PUBLICATIONS

WO 2009081684A1, machine translation Ozaki et al. PUB: 20090207.*
(Continued)

*Primary Examiner* — Susan D Leong
(74) *Attorney, Agent, or Firm* — Procopio, Cory, Hargreaves & Savitch LLP

(57) ABSTRACT

A semiconductor substrate comprises a semiconductor region of one conductivity type and a layer of another conductivity type with first, second and side surfaces. Over surfaces on the first surface side, the side surface side and an outer peripheral portion on the second surface side of the semiconductor region, the layer is formed. An electrode of the one conductivity type is located on the second surface adjacent to the layer. The semiconductor substrate includes a trench located between the outer periphery of the second surface and an end of the electrode with a spacing from the electrode and configured to isolate the layer along the outer periphery of the second surface. When viewed from the second surface side, a shortest distance between the end of the electrode and the trench is smaller than a shortest distance between a junction of the layer of the side surface side and the trench.

15 Claims, 16 Drawing Sheets

(56) References Cited

U.S. PATENT DOCUMENTS

| | | | |
|---|---|---|---|
| 4,989,059 A | 1/1991 | Micheels et al. | |
| 5,461,002 A | 10/1995 | Safir | |
| 5,665,175 A * | 9/1997 | Safir | 136/255 |
| 7,517,789 B2 * | 4/2009 | Daubenspeck et al. | 438/613 |
| 2003/0037815 A1* | 2/2003 | Kim et al. | 136/256 |
| 2009/0159111 A1* | 6/2009 | Jawarani et al. | 136/244 |
| 2009/0165849 A1* | 7/2009 | Chan et al. | 136/256 |
| 2009/0272429 A1* | 11/2009 | Lu et al. | 136/252 |
| 2010/0258177 A1* | 10/2010 | Ko et al. | 136/256 |

FOREIGN PATENT DOCUMENTS

| | | |
|---|---|---|
| JP | H05-075148 A | 3/1993 |
| JP | H05-508742 A | 12/1993 |
| JP | 2002-198546 A | 7/2002 |
| JP | 2002-353475 A | 12/2002 |
| WO | 2006/087786 A1 | 8/2006 |
| WO | 20091081684 A1 | 7/2009 |

OTHER PUBLICATIONS

International Search Report and Written Opinion dated Nov. 30, 2010, issued for International Application No. PCT/JP2010/066988.

Office action dated Apr. 8, 2014 issued in counterpart Chinese application No. 201080015834.X.

* cited by examiner

F I G . 4
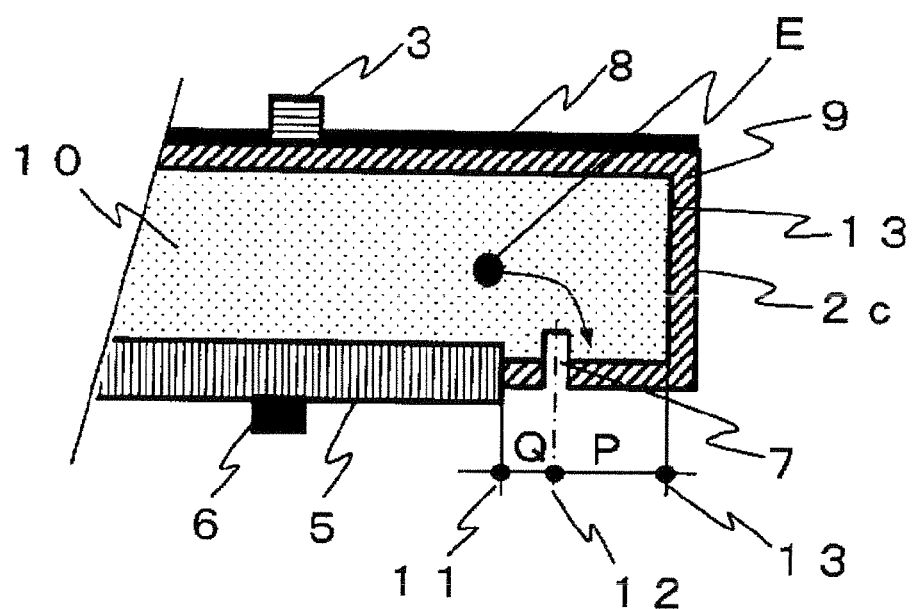

F I G . 1 2
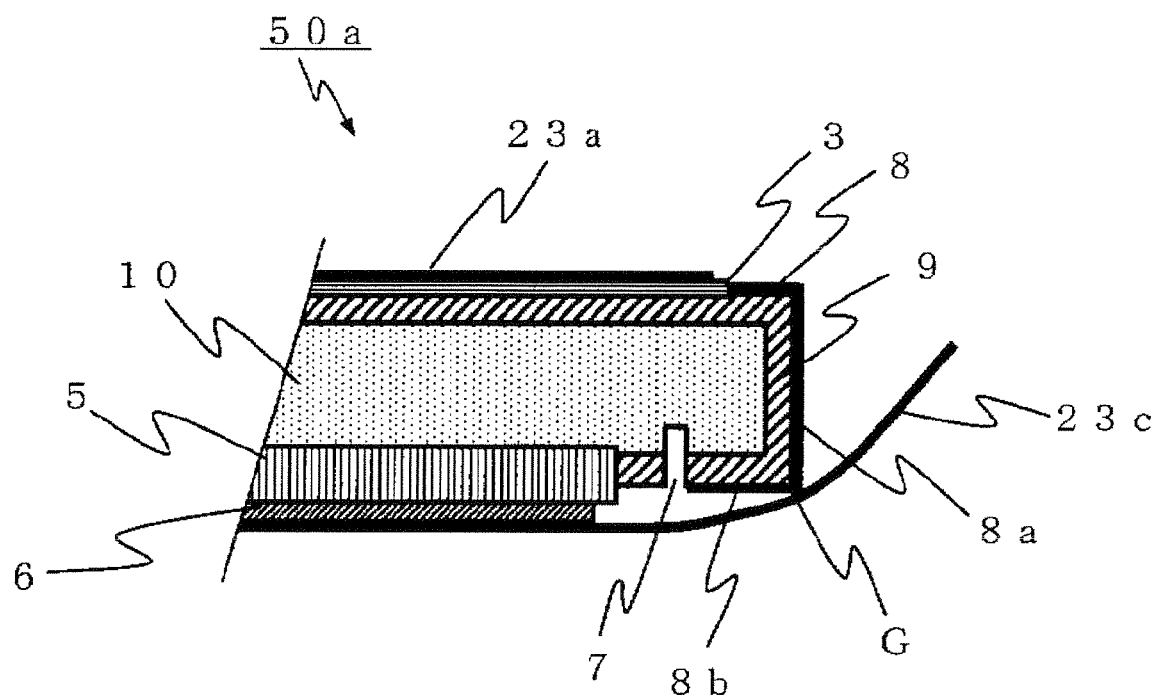

SOLAR CELL ELEMENT AND SOLAR CELL MODULE

TECHNICAL FIELD

The present invention relates to a solar cell element used in photovoltaic power generation.

BACKGROUND ART

Recently, as energy issues and environmental issues are becoming increasingly serious, photovoltaic power generation with the use of solar cell elements that convert light energy directly into electrical energy is receiving attention.

Solar cell elements that are produced with semiconductor substrates such as a single-crystal silicon substrate and a poly-crystal silicon substrate are becoming mainstream. It is required to perform pn isolation for insulation between a p-type part and an n-type part in the solar cell element including a semiconductor substrate.

The methods using a laser are proposed as the method of performing pn isolation (see Patent Documents 1 to 4: Japanese Patent Application Laid-Open No. 05-75148 (1993), WO 2006/087786, U.S. Pat. No. 4,989,059 A, and Japanese Patent Application Laid-Open No. 2002-198546).

SUMMARY OF THE INVENTION

Problem to be Solved by the Invention

Unfortunately, in pn isolation using a laser as disclosed in the above-mentioned documents, minority carriers generated inside of a semiconductor substrate are not sufficiently trapped, resulting in a reduction of photoelectric conversion efficiency of the solar cell element in some cases.

This leads to demands for solar cell elements whose photoelectric conversion efficiency is enhanced by increasing the efficiency of trapping the minority carriers generated in an interior region (bulk region) of the semiconductor substrate.

Means to Solve the Problem

A solar cell element according to an embodiment of the present invention includes: a semiconductor substrate that comprises a semiconductor region of one conductivity type and a layer of an opposite conductivity type to the one conductivity type with a first surface serving as a light-receiving surface, a second surface located on a back side of the first surface, and a side surface connecting the first surface and the second surface, in which over a surface on the first surface side, a surface on the side surface side and a surface of an outer peripheral portion on the second surface side of the semiconductor region of the one conductivity type, the layer of the opposite conductivity type to the one conductivity type is formed such that a first pn junction region is provided along the respective surfaces of the first surface, the side surface and the outer peripheral portion of the second surface; and a first electrode of the one conductivity type located on the second surface so as to be adjacent to the first pn junction region. Further, the semiconductor substrate includes a first trench portion located between the outer periphery of the second surface and an end portion of the first electrode with a spacing from the first electrode and configured to isolate the first pn junction region on the second surface along the outer periphery of the second surface. When viewed from the second surface side in plan view, a shortest distance Q between the end portion of the first electrode and the first trench portion is smaller than a shortest distance P between a pn junction of the first pn junction region of the side surface side and the first trench portion.

Effects of the Invention

According to the solar cell element of the embodiment of the present invention, it is possible to reduce the moving distance of the minority carriers, which have generated in a central region (bulk region) of a semiconductor substrate of one conductivity type, to the semiconductor layer of an opposite conductivity type, leading to a reduction in recombination of minority carriers. This leads to an increase in the efficiency of trapping minority carriers, which improves the photoelectric conversion efficiency of the solar cell element.

BRIEF DESCRIPTION OF DRAWINGS

FIG. 4 is a partial cross-sectional view of the solar cell element, which schematically shows a movement of a minority carrier generated in a central region (bulk region) of a substrate.

FIG. 10A is a plan view of the solar cell module 21 and FIG. 10B is a schematic cross-sectional view describing a lamination structure of a solar cell panel 22 of the solar cell module 21.

FIG. 12 is a cross-sectional view taken along a line X-X of FIG. 11, which shows the state in which the connecting conductor 23 is connected to the solar cell element 50a.

13A is an external view of the solar cell element X viewed from a light-receiving surface side and FIG. 13B is an external view of the solar cell element X viewed from a back surface side.

EMBODIMENTS FOR CARRYING OUT THE INVENTION

<As to Solar Cell Element>

First, a solar cell element according to an embodiment of the present invention is described with respect to the accompanying drawings.

Figure 1A:
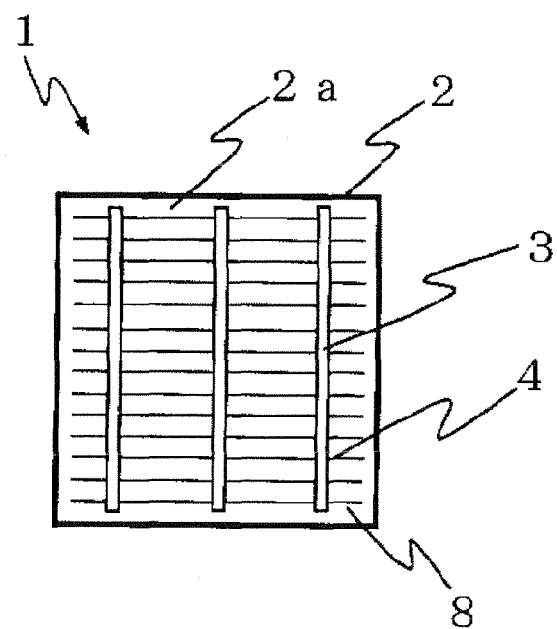
FIG. 1A is a plan view showing an appearance on a light-receiving surface side of a solar cell element according to an embodiment of the present invention.
Figure 1B:
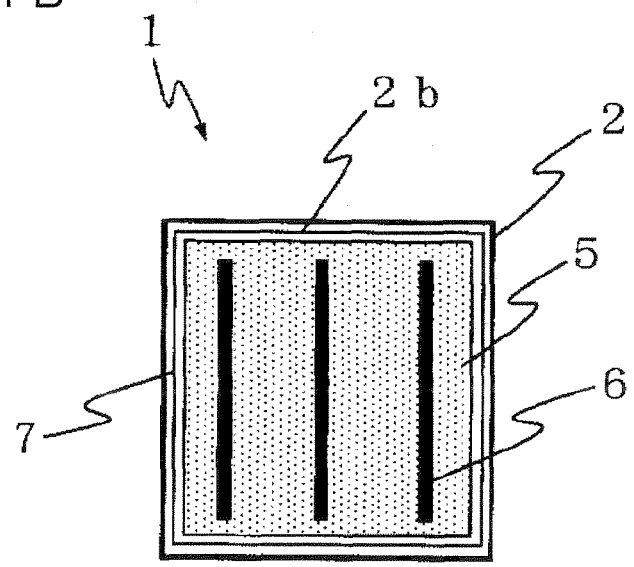
FIG. 1B is a plan view showing an appearance on a back surface side thereof.

As shown in FIGS. 1A and 1B, a solar cell element 1 according to a first embodiment includes a semiconductor substrate 2, bus bar electrodes 3, finger electrodes 4, a collector electrode (first electrode) 5 and output extraction electrodes 6.

The semiconductor substrate 2 has a first surface 2a on a side on which light is incident, a second surface (back surface) 2b opposed to the first surface 2a, and a side surface 2c that is located between the first surface 2a and the second surface (back surface) 2b and connects the first surface 2a and the second surface 2b. The second surface 2b is a surface positioned on a back side of the first surface 2a and has an approximately identical shape to that of the first surface 2a. The semiconductor substrate 2 has one conductivity type (for example, p-type).

The bus bar electrodes 3 and the finger electrodes 4 are provided on the first surface 2a of the semiconductor substrate 2 and are electrically connected to a semiconductor substrate part having another conductivity type (for example, n-type).

The collector electrode 5 and the output extraction electrodes 6 are provided on the back surface 2b and are connected to a semiconductor substrate part having one conductivity type (for example, p-type).

Description is given below by taking the semiconductor substrate 2 of one conductivity type as the p-type semiconductor substrate 2 as well.

The semiconductor substrate 2 is comprised of single-crystal silicon, poly-crystal silicon or the like. The semiconductor substrate 2 is a rectangular flat plate that is approximately 150 to 160 mm on a side and approximately 150 to 250 µm in thickness. The region in which p-type silicon and n-type silicon are bonded (first pn junction region) is formed in the semiconductor substrate 2. The first pn junction region is provided along an outer peripheral surface of the semiconductor substrate 2, which is provided over the first surface 2a, the side surface 2c and the outer peripheral portions of the second surface 2b. Specifically, the first pn junction region is provided to an almost entire surface of the first surface 2a, an almost entire surface of the side surface 2c and the outer peripheral portion of the second surface 2b on which the collector electrode 5 is not provided.

As shown in FIG. 1A, the electrodes on the first surface 2a side include the bus bar electrodes 3 and the finger electrodes 4 as n-type electrodes. The bus bar electrode 3 has a large width of approximately 1 mm to 3 mm, and about two to four are provided on the first surface 2a approximately in a parallel manner. A large number of finger electrodes 4 are provided on the first surface 2a at intervals of approximately 2 to 5 mm so as to intersect those bus bar electrodes 3 almost perpendicularly. The finger electrode 4 has a width of approximately 50 to 200 µm. The above-mentioned bus bar electrode 3 and finger electrode 4 have a thickness of approximately 10 to 20 µm. An antireflection film 8 for improving light absorption may be formed over the entire first surface 2a.

As shown in FIG. 1B, the electrodes on the second surface 2b side include the collector electrode 5 and the output extraction electrodes 6 as p-type electrodes. The collector electrode 5 is formed over almost the entire second surface 2b of the semiconductor substrate 2 except for an outer peripheral portion thereof. The output extraction electrode 6 has a width of approximately 2 mm to 5 mm and extends in the same direction as the direction in which the bus bar electrodes 3 extend, and about two to four are provided on the second surface 2b. At least part of the output extraction electrode 6 electrically abuts on the collector electrode 5. The output extraction electrode 6 has a thickness of approximately 10 µm to 20 µm, and the collector electrode 5 has a thickness of approximately 15 µm to 50 µm.

The above-mentioned finger electrodes 4 and collector electrode 5 serve to collect generated carriers. The bus bar electrodes 3 and the output extraction electrodes 6 serve to collect the carriers (power) collected by the finger electrodes 4 and the collector electrode 5 and outputting those to the outside.

As described above, the first pn junction region is provided to the outer peripheral portion of the second surface 2b in which the collector electrode 5 is not provided. Therefore, the collector electrode 5 is provided adjacent to the first pn junction region on the second surface 2b.

In the present embodiment, a first trench portion 7 for performing pn isolation is formed between the outer periphery of the second surface 2b of the semiconductor substrate 2 and the end portion of the collector electrode 5. The first trench portion 7 isolates the first pn junction region of the second surface 2b along the outer periphery of the second surface 2b.

In the solar cell element 1 having the above-mentioned configuration, the light that has entered from the first surface 2a side being a light-receiving surface side is absorbed and photoelectrically converted by the semiconductor substrate 2, whereby a pair of electron and hole (electron carrier and hole carrier) is generated. The electron carrier and hole carrier (photogenerated carriers) of a light excitation source are collected by the above-mentioned electrodes provided on the first surface 2a and the second surface 2b of the solar cell element by the action of the first pn junction region described above, to thereby generate a potential difference between those electrodes.

<Method of Manufacturing Solar Cell Element>

Figure 2A:
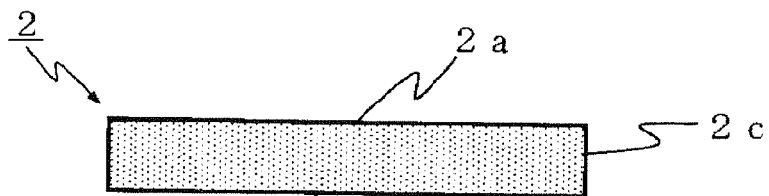
FIGS. 2A to 2E are cross-sectional views showing a manufacturing process of the solar cell element according to the embodiment of the present invention.

First, as shown in FIG. 2A, the semiconductor substrate 2 having a flat plate shape is prepared, which is obtained by, for example, slicing a silicon ingot. A p-type substrate comprised of single-crystal or poly-crystal silicon can be used as the semiconductor substrate 2. For example, it is possible to use the semiconductor substrate 2 that is a p-type conductivity type and has a resistivity of approximately 0.2 to 2.0 Ω·cm, which is obtained by adding a minute amount of impurities such as boron (B).

More specifically, the semiconductor substrate 2 is manufactured by, for example, a pulling method such as Czochralski method in the case of using a single-crystal semiconductor substrate. In the case of using a poly-crystal semiconductor substrate, the semiconductor substrate 2 is manufactured by slicing a silicon ingot manufactured by the casting method or the like to have a thickness of 350 μm or smaller, more preferably, approximately 150 to 250 μm with a wiresaw.

The semiconductor substrate 2 may have a circular, square or rectangular shape. As to the size thereof, the diameter thereof may be approximately 100 to 200 mm in the case of a circular shape, or the side thereof may be approximately 100 to 200 mm in the case of a square or rectangular shape. The semiconductor substrate 2 having any shape has the first surface 2a, the second surface 2b and the side surface 2c as described above.

A damaged layer of several micron to several tens of micron, which is caused by slicing, is formed on the surface of the semiconductor substrate 2 immediately after slicing, and minute contaminants during slicing adhere to the surface of the damaged layer. Therefore, in order to remove a damaged layer and clean off contaminants, the semiconductor substrate 2 is immersed in an alkaline solution of sodium hydroxide (NaOH) or potassium hydroxide (KOH) or the like and is then washed and dried.

Figure 2B:
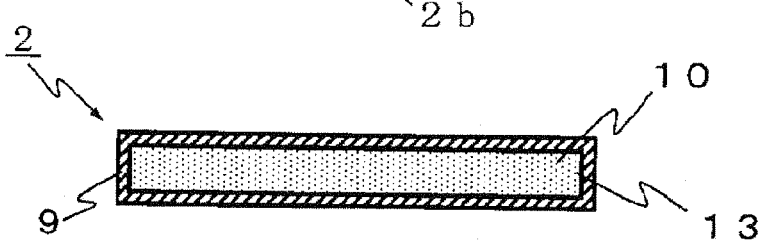

After that, as shown in FIG. 2B, an n-layer 9 is formed over the entire surface of the semiconductor substrate 2. That is, the n-layer 9 is formed over the first surface 2a, the side surface 2c and second surface 2b of the semiconductor substrate 2. Phosphorus (P) may be used as an n-type doping element. An n-type layer having a sheet resistance of approximately 30 to 150Ω/□ may be used. This enables to form a pn junction 13 between the above-mentioned p-type bulk region 10 and the n-layer 9.

The n-layer 9 is formed by, for example, the vapor-phase thermal diffusion method in which the semiconductor substrate 2 is treated for approximately 20 to 40 minutes in an atmosphere into which gaseous $POCl_3$ (phosphorus oxychloride) is introduced as a diffusion source while keeping the temperature raised to approximately 700 to 900° C. The use of the above-mentioned method allows the formation of the n-layer 9 of approximately 0.2 to 0.7 μm.

Figure 2C:
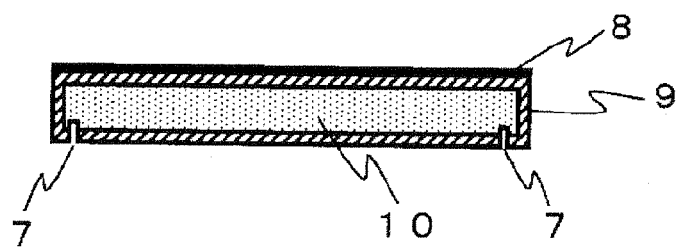

After that, as shown in FIG. 2C, the first trench portion 7 having a depth equal to or more than a depth to such an extent that it reaches the pn junction 13 formed on the outer peripheral portion of the second surface 2b of the semiconductor substrate 2 is formed on the second surface 2b to perform pn isolation.

It is possible to form the first trench portion 7 by a laser, dicing process, water jet, or by applying an acid-resistant resist onto the part of the second surface 2b other than the position at which the first trench portion 7 is formed and then performing etching with a mixture of hydrofluoric acid and nitric acid. The laser is preferably used in terms of easily controlling the depth or the like of the first trench portion 7 and cost.

In the case of forming the first trench portion 7 with a laser, it is possible to use a YAG (yttrium.aluminum.garnet) laser (having a wavelength of 1,064 nm), a second harmonic generation (SHG)-YAG laser (having a wavelength of 532 nm), a $YVO_4$ (yttrium.vanadate) laser (having a wavelength of 1,064 nm), an excimer laser (having a wavelength of 193 to 353 nm) or the like.

The conditions in the case of using the YAG laser are a TEM wave, an output of approximately 5 to 30 W, and a pulse output, where the frequency of an output beam pulse is 1 Hz to 1 MHz, a beam pulse width is 100 femtoseconds to 100 microseconds, and a beam profile is a top hat type.

Used as the method of forming the first trench portion 7 in the case of using a laser are, for example, the method of performing laser irradiation while scanning an irradiation position of a laser to a predetermined spot on the surface of the semiconductor substrate 2 with a galvanometer minor or the like and the method of performing pulse laser irradiation while moving a work table on which the semiconductor substrate 2 is placed at a constant speed by a servo motor controlled by, for example, a sequencer.

Further, in forming the first trench portion 7 by laser irradiation, the gas for inactivating the inner peripheral surface of the first trench portion 7 can be sprayed on the inner surface of the first trench portion 7. This reduces the occurrence of a leakage current of the solar cell element 1 due to the thermal damage and mechanical damage in the formation of the first trench portion 7 by a laser. Gaseous nitrogen, gaseous oxygen, gaseous carbon dioxide, vapor or the like can be used as the above-mentioned gas for inactivating the inner peripheral surface of the first trench portion 7.

In the case of using gaseous nitrogen as the gas for inactivating the inner peripheral surface of the first trench portion 7, it is possible to reduce the oxidation of a residue generated during the formation of the first trench portion 7 by laser irradiation. As a result, it is possible to reduce the generation of leakage current due to the residue remaining inside of the first trench portion 7 and exhibiting conductivity.

As shown in FIG. 2C, the antireflection film 8 is formed on the first surface 2a before or after the formation of the first trench portion 7. A silicon nitride film (SiNx film with a wide compositional ratio (x) around $Si_3N_4$ stoichiometry), $TiO_2$ film, $SiO_2$ film, MgO film, ITO film, $SnO_2$ film, ZnO film or the like can be used as the material of the antireflection film 8. The thickness thereof is appropriately selected depending on the material, which may be a thickness so as to achieve the conditions of anti-reflection on proper incoming light. For example, in the case of the semiconductor substrate 2 comprised of silicon, it suffices that the antireflection film 8 is set to have a refractive index of approximately 1.8 to 2.3 and a thickness of approximately 500 to 1,200 Å. The antireflection film 8 can be formed by the plasma CVD method, vapor deposition method, sputtering method or the like.

Figure 2D:
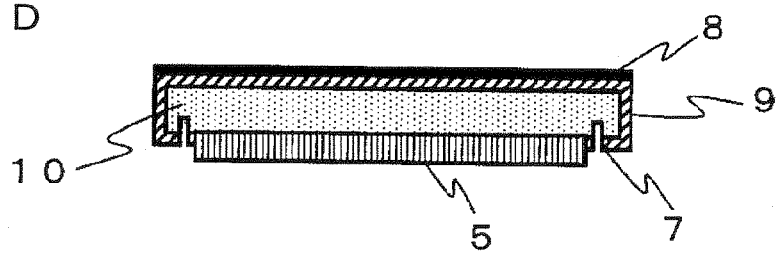

Next, as shown in FIG. 2D, the collector electrode 5 is formed on the second surface 2b of the semiconductor substrate 2. The collector electrode 5 is formed through application of a paste mainly containing aluminum onto the entire second surface 2b except for the outer peripheral portion, for example, except for the portion of approximately 1 to 5 mm from the outer periphery of the second surface 2b. The screen printing method or the like can be used as the method of applying a paste. A paste comprised of an aluminum powder, an organic vehicle and the like can be used as the paste used in the formation of the collector electrode 5. This paste is applied and then heat-treated (fired) at a temperature of approximately 700 to 850° C., to thereby bake aluminum onto the semiconductor substrate 2. The applied aluminum paste is printed and fired, whereby aluminum being p-type impurities is diffused in the application part of the semiconductor substrate 2 at a high concentration. Accordingly, it is possible to convert the n-layer 9 formed also on the second surface 2b to a p-type highly doped layer. As shown in FIG. 2D, the collector electrode 5 is formed on the inner portion with respect to the first trench portion 7 provided on the outer peripheral portion of the second surface 2b.

Figure 2E:
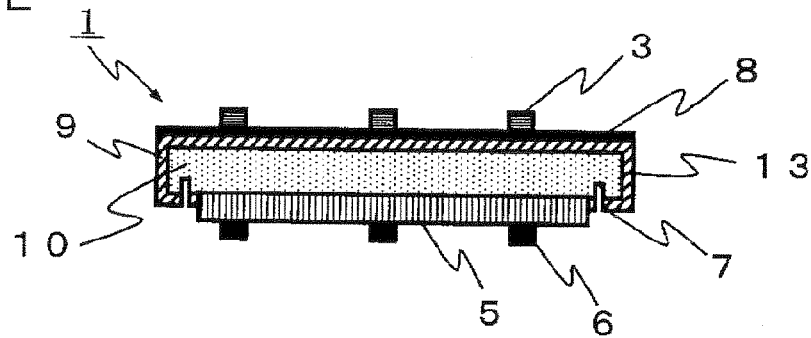

Next, as shown in FIG. 2E, the electrodes on the first surface 2a, that is, the bus bar electrodes 3 and the finger electrodes 4 (not shown), and the output extraction electrodes 6 on the second surface 2b are formed.

The output extraction electrodes 6 on the second surface 2b are formed by application of a conductive paste mainly containing silver. For example, a paste obtained by blending 5 to 30 parts by weight of organic vehicle and 0.1 to 15 parts by weight of glass frit to 100 parts by weight of silver filler, kneading the resultant, and adjusting the viscosity to approximately 50 to 200 Pa·S with a solvent can be used as the conductive paste mainly containing silver.

As the application method, the screen printing method or the like can be used, and a solvent may be transpired at a predetermined temperature after the application and then dried. After that, firing is performed at a maximum temperature of 500 to 650° C. for several tens of seconds to several tens of minutes in a furnace, to thereby form the output extraction electrodes 6.

Next, the electrodes (bus bar electrodes 3 and finger electrodes 4) on the first surface 2a of the semiconductor substrate 2 are formed. The bus bar electrodes 3 and the finger electrodes 4 are also formed by application, drying and firing of a conductive paste mainly containing silver by, for example, the screen printing method as described above. Through the above-mentioned process, the solar cell element 1 can be manufactured.

Figure 3A:
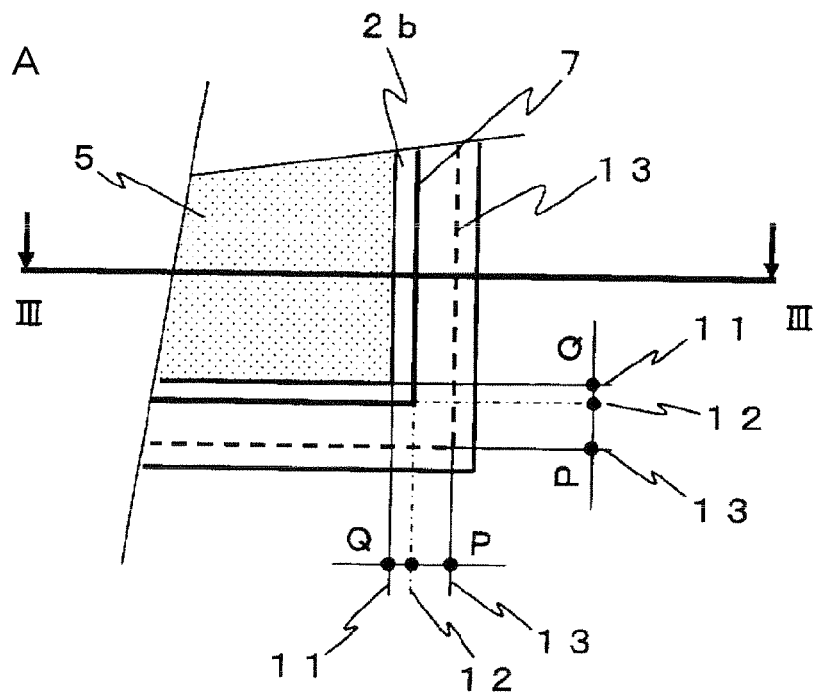
FIG. 3A is a plan view showing a corner portion of the solar cell element according to the embodiment of the present invention.
Figure 3B:
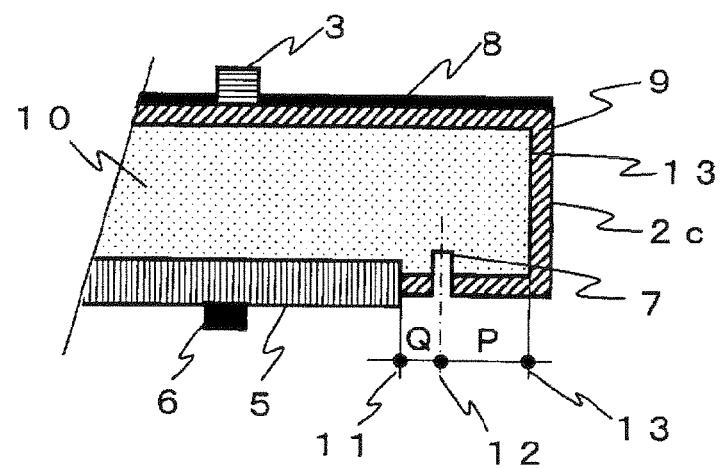
FIG. 3B is a cross-sectional view taken along a line III-III of FIG. 3A.

Next, the configuration of the first trench portion 7 according to the present embodiment is described with respect to FIGS. 3A and 3B and FIG. 4.

As shown in FIGS. 3A and 3B, the first trench portion 7 is spaced from the collector electrode 5 in the solar cell element 1 according to the present embodiment. Then, a shortest distance Q between an end portion 11 of the collector electrode 5 and the first trench portion 7 is smaller than a shortest distance P between the pn junction 13 of the side surface 2c and the first trench portion 7.

More specifically, as shown in FIG. 3B, the shortest distance Q is the shortest distance between the end portion 11 of the collector electrode 5 and a center line 12 in the width direction of the first trench portion 7. The shortest distance P is the shortest distance between the pn junction 13 of the side surface 2c and the center line 12 in the width direction of the first trench portion 7.

Note that the width direction of the first trench portion 7 herein is the direction perpendicular to the side surface 2c when viewed from the second surface 2b side as shown in FIGS. 3A and 3B. The center line 12 in the width direction of the first trench portion 7 is the center line in the width direction of the aperture of the first trench portion 7.

FIG. 4 schematically shows the movement of a minority carrier E generated in the p-type bulk region (central region) 10 inside of the semiconductor substrate 2 in a case where the shortest distance Q between the end portion 11 of the collector electrode 5 and the center line 12 in the width direction of the first trench portion 7 is smaller than the shortest distance P between the pn junction 13 of the side surface 2c and the center line 12 in the width direction of the first trench portion 7.

In the present embodiment, the shortest distance Q is smaller than the shortest distance P as described above. As shown in FIG. 4, the above-mentioned configuration makes the moving distance of the minority carrier E to the n-layer 9 small. This results in an increase of the efficiency of trapping a minority carrier, leading to an improvement in the photoelectric conversion efficiency of the solar cell element 1.

The position of the pn junction 13 from the side surface 2c is determined by, for example, the determination method from the concentration distribution in the depth direction of n-type and p-type impurities with the use of the secondary ion mass spectrometry (SIMS) method or by the method of drilling the side surface 2c with a ball using a spherical driller, and dropping a hydro-fluoric acid (HF) solution (stain solution) containing approximately 0.1% of nitric acid ($HNO_3$) while irradiating with light, to thereby form a stain film in a p-type part.

Figure 5A:
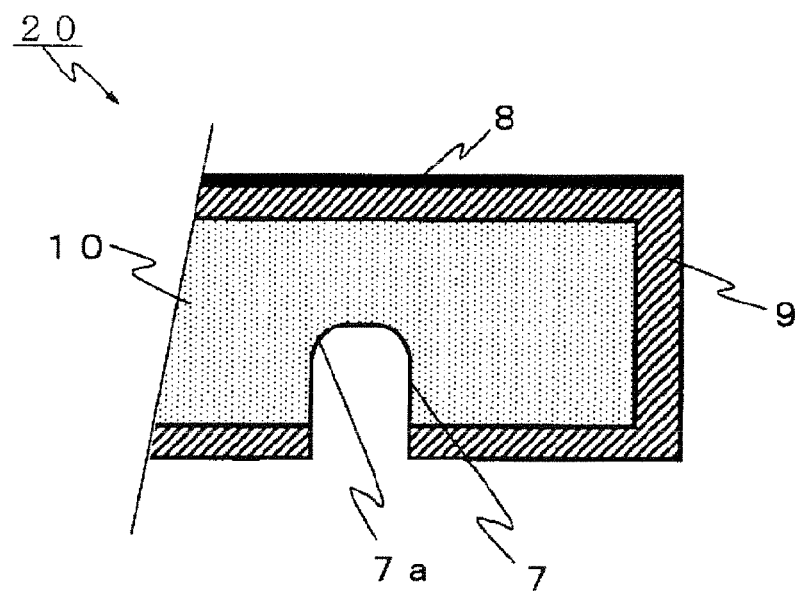
FIGS. 5A and 5B are partial cross-sectional views showing solar cell elements, which show a cross-sectional shape of a first trench portion according to embodiments of the present invention.
Figure 5B:
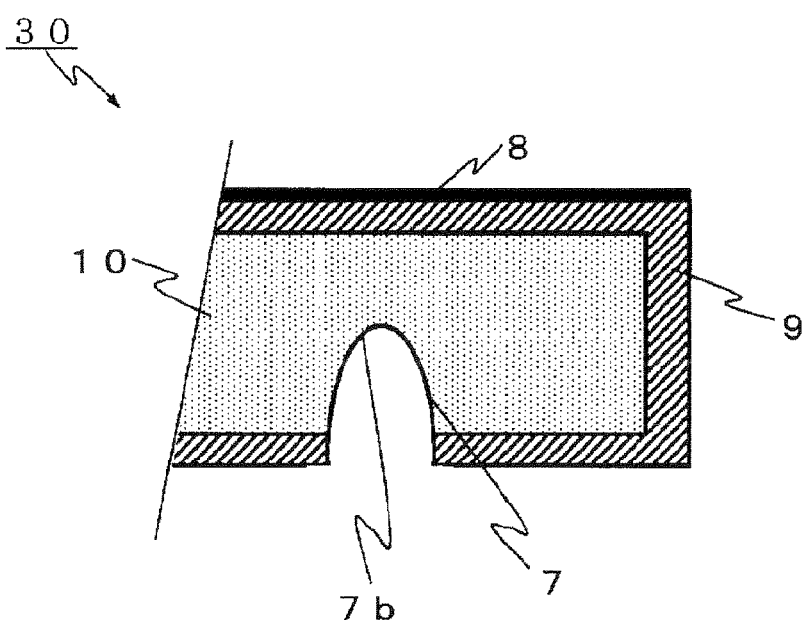

Next, solar cell elements 20 and 30 according to second and third embodiments are described with respect to FIGS. 5A and 5B. FIGS. 5A and 5B are partial cross-sectional views showing the solar cell elements 20 and 30, which correspond to FIG. 3B being a cross-sectional view in the vicinity of the first trench portion 7 of the solar cell element 1. The solar cell elements 20 and 30 are each different from the solar cell element 1 in the shape of the first trench portion 7. Here, a similar configuration to that of the solar cell element 1 is not described.

As shown in FIG. 5A, the first trench portion 7 of the solar cell element 20 includes a curved portion 7a from the bottom to the inner side surface in a cross-sectional shape perpendicular to the second surface 2b.

The temperature of the portion in the vicinity of the first trench portion 7 is raised high in forming the first trench portion 7 through irradiation of a laser. This tends to generate a high concentration impurity region in the vicinity of the inner peripheral surface of the first trench portion 7, in which silicon is melted and then solidified. This high concentration impurity region that has been melted and solidified includes impurities in the formation of the first trench portion 7 in addition to the impurities of the n-layer 9 and the p-type bulk region 10 in melting. This makes the high concentration impurity region have a high conductivity, which may increase the leakage current of the solar cell element.

Therefore, in the second embodiment, the first trench portion 7 includes the curved portion 7a from the bottom to the inner side surface in the cross-sectional shape perpendicular to the second surface 2b as described above. This increases, on the inner peripheral surface of the first trench portion 7, the distance from one end portion to the other end portion of the high concentration impurity region that has been melted and solidified. This reduces an increase in leakage current of the solar cell element 20. The first trench portion 7 having the above-mentioned shape can be formed with a high output YAG laser and, in that case, it suffices that the output is set to, for example, 10 W or larger.

Further, in the solar cell element 30 according to the third embodiment, the curved portion from the bottom to the inner side surface of the first trench portion 7 has an oval shape 7b in the cross-sectional shape perpendicular to the second surface 2b, as shown in FIG. 5B. This enables to further increase the distance from one end portion to the other end portion of the high concentration impurity region that has been melted and solidified and to reduce chipping in the end portion of the first trench portion 7. This enhances the effect of reducing an increase in leakage current and achieves an effect that chipping of the solar cell element 30 is reduced. It is also possible to form the first trench portion 7 having the above-mentioned shape with the use of a high output YAG laser and, in that case, it suffices that the output is set to, for example, 12 W or larger.

Figure 6A:
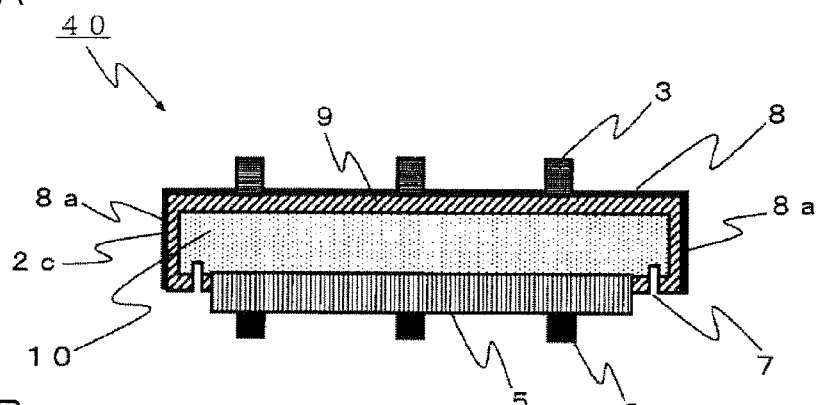
FIGS. 6A to 6C are cross-sectional views and a partial cross-sectional view of solar cell elements according to other embodiments of the present invention.
Figure 6B:
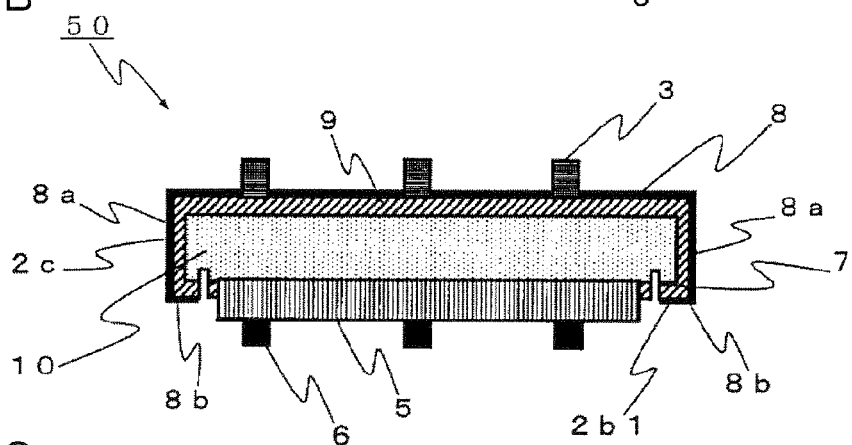
Figure 6C:
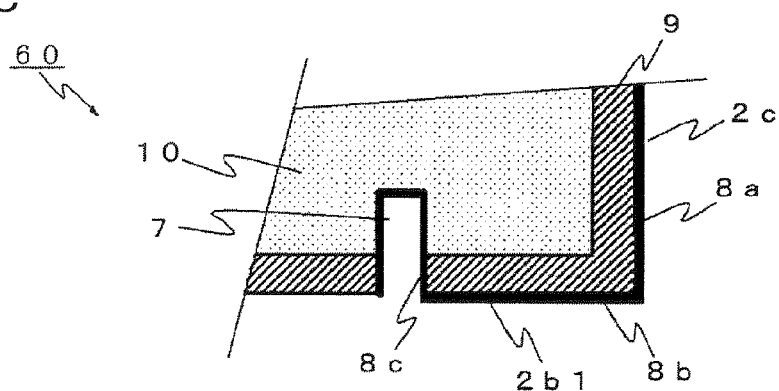

Next, solar cell elements 40, 50 and 60 according to fourth to sixth embodiments of the present invention are described. FIGS. 6A and 6B are cross-sectional views of the solar cell elements 40 and 50, and FIG. 6C is a partial cross-sectional view showing the portion in the vicinity of the first trench portion 7 of the solar cell element 60. The solar cell elements 40, 50 and 60 are different from the solar cell element 1 in the configuration of the antireflection film 8.

As shown in FIG. 6A, in the solar cell element 40, the antireflection film 8 is provided not only on the first surface 2a of the semiconductor substrate 2 but also on the side surface 2c. The present embodiment achieves a passivation effect for a grain boundary and a damaged layer of the side surface 2c by the provision of the antireflection film 8a on the side surface 2c. Accordingly, it is possible to reduce a possibility that the trapped minority carrier may disappear by recombination in the n-layer 9 provided on the side surface 2c. This results in the enhancement of the above-mentioned effect.

As described above, the antireflection film 8a can be provided on the side surface 2c by, for example, deposition of the antireflection films 8 and 8a by plasma CVD that has a larger wraparound effect.

Further, in the solar cell element 50, the antireflection film 8 is also provided to the outer peripheral portion 2b1 of the second surface 2b in addition to the first surface 2a and the side surface 2c of the semiconductor substrate 2, as shown in FIG. 6B. That is, differently from the solar cell element 40, the antireflection film 8b is also provided to the outer peripheral portion 2b1 region of the second surface 2b, which extends from the end portion of the second surface 2b to the first trench portion 7. This achieves a passivation effect also in this part, leading to a reduction of disappearance of the trapped minority carrier due to recombination in the n-layer 9 provided in the outer peripheral portion 2b1 region.

It is possible to provide the antireflection film 8b in the outer peripheral portion 2b1 region as described above by, for example, depositing the antireflection film 8 such that the generated plasma wraps around the second surface 2b side of the semiconductor substrate 2 in the plasma CVD of parallel plate type. It is possible to allow the generated plasma to wrap around the second surface 2b side of the semiconductor substrate 2 by forming, for example, a recess in the outer peripheral portion of the position at which the substrate semiconductor 2 is placed, on the susceptor for placing the semiconductor substrate 2 thereon in the plasma CVD apparatus.

Further, in the solar cell element 60, an antireflection film 8c is also formed on the inner peripheral surface of the first trench portion 7 in addition to the first surface 2a, the side surface 2c and the outer peripheral portion 2b1 of the second surface 2b, as shown in FIG. 6C. The provision of the antireflection film 8c on the inner peripheral surface of the first trench portion 7 achieves a passivation effect in this part, which makes it possible to reduce an increase of leakage current in this part.

The antireflection film 8c can be provided on the inner peripheral surface of the first trench portion 7 as described above by, for example, deposition of the antireflection film 8 such that the generated plasma wraps around the first trench portion 7 on the second surface 2b side of the semiconductor substrate 2 in the plasma CVD of parallel plate type. It is possible to allow the generated plasma to wrap around the first trench portion 7 on the second surface 2b side of the semiconductor substrate 2 by forming a recess up to a position to reach the first trench portion 7 in an outer peripheral portion of a position at which the semiconductor substrate 2 is placed, on the susceptor for placing a semiconductor substrate thereon.

Note that a film comprised of silicon nitride having a large passivation effect can be used for the above-mentioned antireflection films 8, 8a, 8b and 8c. Films having different film quality and film thickness from those of the antireflection film 8 formed on the first surface 2a may be used for the respective antireflection films 8a, 8b and 8c as long as a passivation effect is obtained.

For example, a thickness Wc of the antireflection film 8c may be smaller than a thickness Wa of the antireflection film 8a and a thickness Wb of the antireflection film 8b. Alternatively, the thickness Wb of the antireflection film 8b may be smaller than the thickness Wa of the antireflection film 8a.

The formation of the first trench portion 7 is not limited to be performed immediately after the formation of the n-layer 9 as described above, and may also be performed, for example, after the formation of the bus bar electrodes 3 and the finger electrodes 4 as long as it is after the formation of the n-layer 9.

Figure 7A:
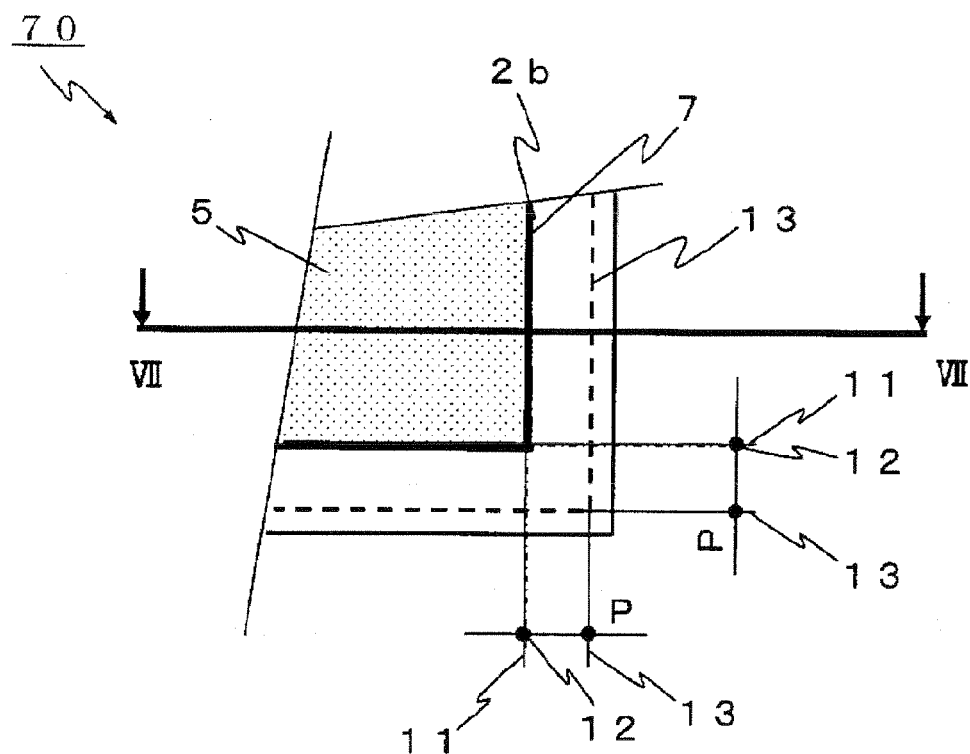
FIG. 7A is a plan view of a corner portion of a solar cell element according to still another embodiment of the present invention.
Figure 7B:
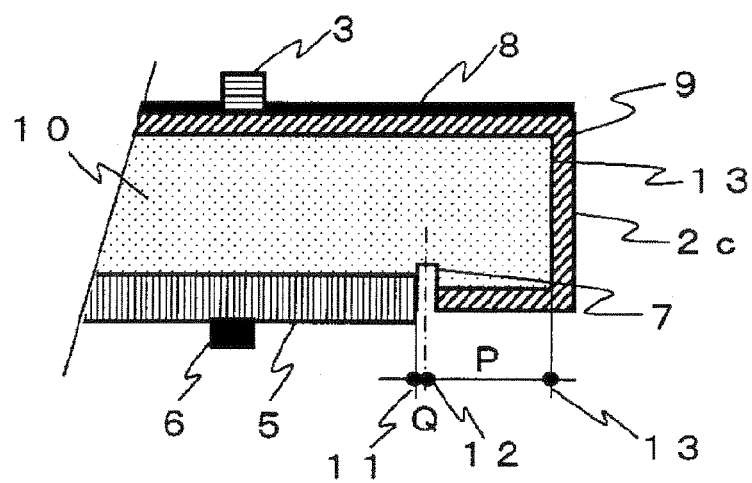
FIG. 7B is a cross-sectional view taken along a line VII-VII of FIG. 7A.

Further, a solar cell element 70 according to a seventh embodiment of the present invention is described with respect to FIGS. 7A and 7B.

As shown in FIGS. 7A and 7B, the collector electrode 5 has an end surface along the arrangement direction of the first trench portion 7, and the end surface is coplanar with the inner peripheral surface of the first trench portion 7. That is, the first trench portion 7 is disposed along the collector electrode 5 so as to be in contact with the collector electrode 5.

In the present embodiment, the above-mentioned shortest distance Q substantially becomes zero. This satisfies the above-mentioned fact that the shortest distance Q is smaller than the shortest distance P also in the present embodiment. Therefore, also in the present embodiment, the moving distance of the minority carrier E can be made small, leading to a reduction of the recombination of the minority carrier E. As a result, an effect of improving photoelectric conversion efficiency can be enhanced.

Figure 8A:
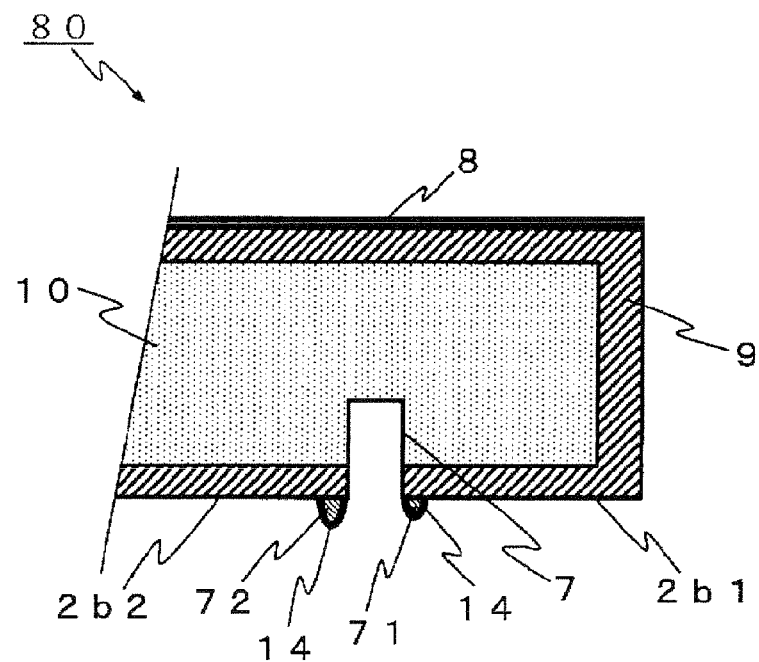
FIG. 8A is a cross-sectional view of a corner portion of a solar cell element 80 according to another embodiment of the present invention.
Figure 8B:
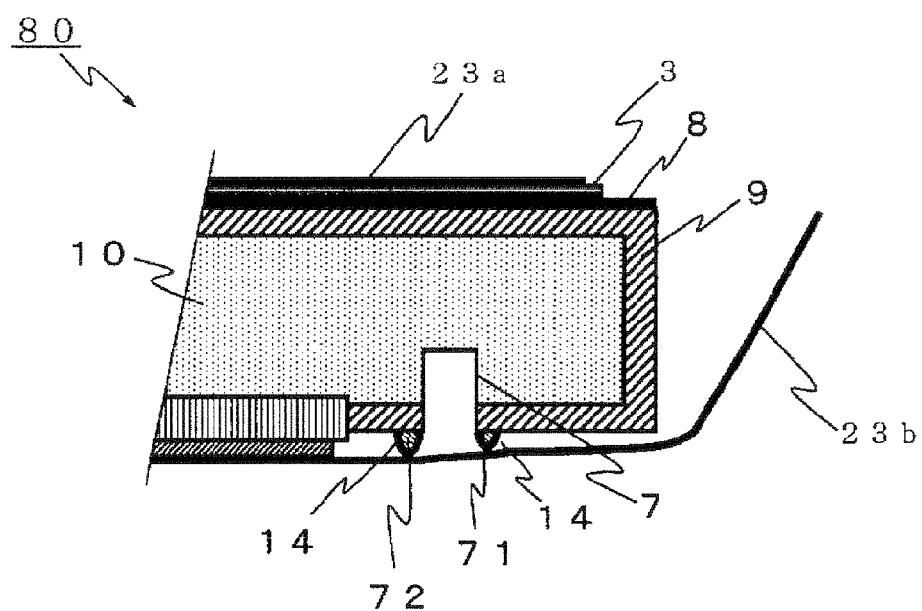
FIG. 8B is a cross-sectional view showing the state in which a connecting conductor 23 is connected to the solar cell element 80.

Next, a solar cell element 80 according to an eighth embodiment of the present invention is described with respect to FIGS. 8A and 8B.

As shown in FIG. 8A, in the solar cell element 80, the first trench portion 7 includes a first bump 71 and a second bump 72. The first bump 71 is positioned at an intersection of the inner peripheral surface of the first trench portion 7 and the second surface 2b1 on the outer side of the second surface 2b with respect to the first trench portion 7. On the other hand, the second bump 72 is positioned at an intersection of the inner peripheral surface of the first trench portion 7 and the second surface 2b2 on the inner side of the second surface 2b with respect to the first trench portion 7.

In the present embodiment, with the first and second bumps 71 and 72 as described above, a connecting conductor 23b abuts on the above-mentioned first and second bumps 71 and 72 in forming the solar cell module, as shown in FIG. 8B. This reduces the contact of the connecting conductor 23b with the n-layer 9, whereby the reliability of a solar cell module including the solar cell element 80 is increased.

Alternatively, as shown in FIG. 8A, the height of the first bump 71 may be equal to or smaller than the height of the second bump 72. As a result, it is possible to apply the pressure received from the connecting conductor 23b to the first bump 71 and the second bump 72 in a distributed manner, leading to a reduction in chipping of the first and second bumps 71 and 72.

The heights of the first bump 71 and the second bump 72 each refer to, for example, a maximum value of the dimension of own bump in the direction perpendicular to the second surface 2b.

The heights of the first bump 71 and the second bump 72 can be made smaller than the depth of the first trench portion 7. The heights of the first bump 71 and the second bump 72 can be appropriately selected in accordance with the depth of the first trench portion 7 and the thickness of the n-layer 9, which may be, for example, approximately 3 nm to 12 nm.

Further, as shown in FIG. 8A, an oxide film 14 may be provided on the first bump 71 and the second bump 72 in the solar cell element 80. Accordingly, the oxide film 14 functions as an insulating film, which further enhances the effect of reducing the contact of the connecting conductor 23b with the n-layer 9.

The thickness of the oxide film 14 can be made larger than that of a native oxide film formed in the other part of the semiconductor substrate 2 of a solar cell element 80 by the formation of the first trench portion 7 with a laser, which may be, for example, approximately 3 nm to 8 nm.

While the first trench portion 7 includes both the first bump 71 and the second bump 72 in the present embodiment, the first trench portion 7 may include only any one of the first bump 71 and the second bump 72.

Figure 9A:
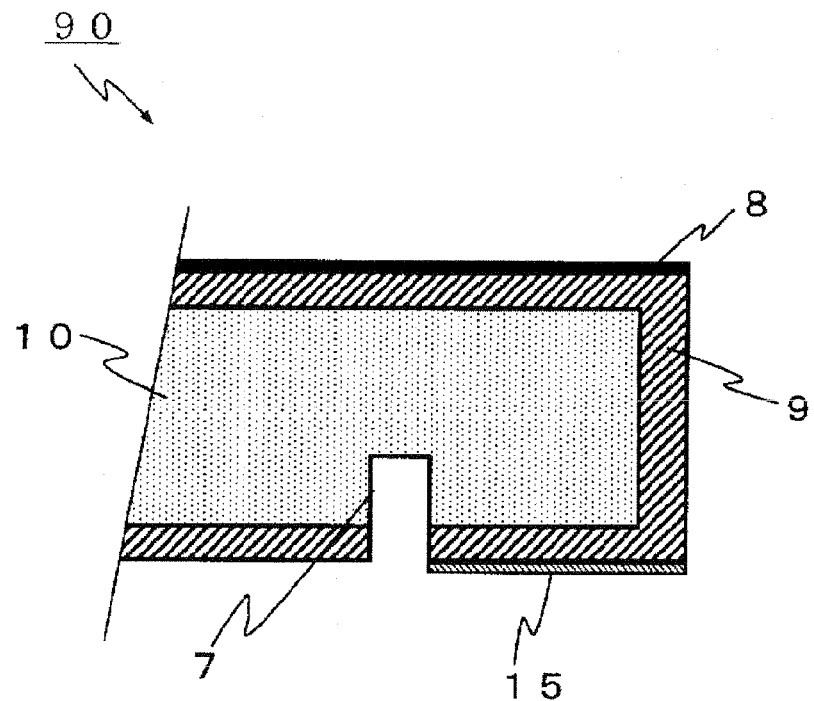
FIG. 9A is a cross-sectional view of a corner portion of a solar cell element 90 according to another embodiment of the present invention.
Figure 9B:
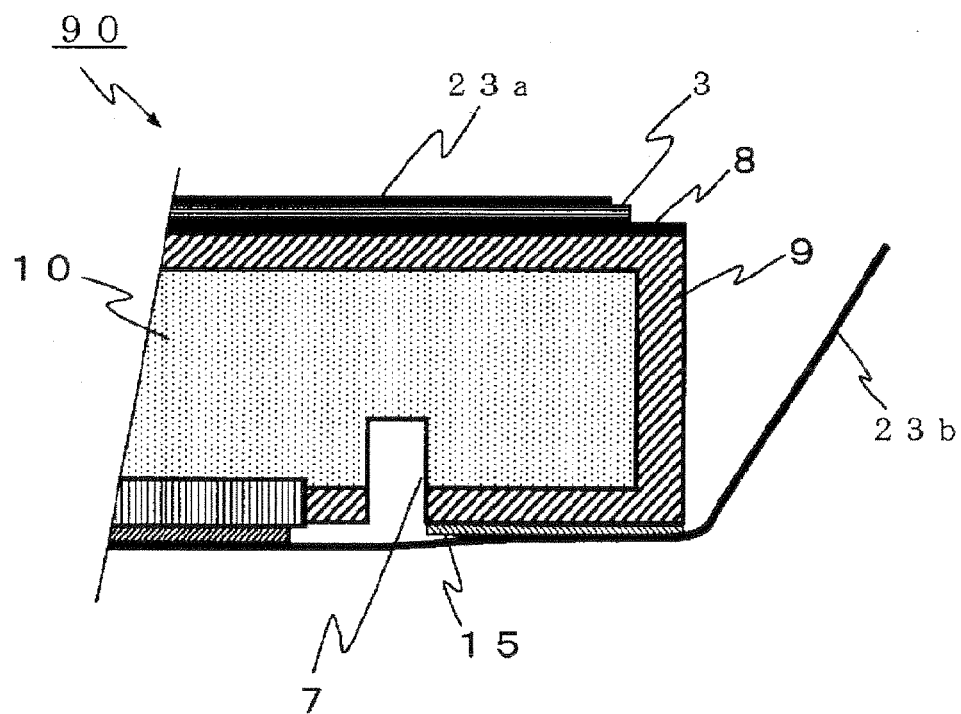
FIG. 9B is a cross-sectional view showing the state in which the connecting conductor 23 is connected to the solar cell element 90.

Next, the solar cell element 90 according to a ninth embodiment of the present invention is described with respect to FIGS. 9A and 9B.

As shown in FIG. 9A, an oxide film 15 is formed between the outer periphery of the second surface 2b and the first trench portion 7 in the solar cell element 90. This achieves a passivation effect and thus improves the conversion efficiency of the solar cell element 90 in the present embodiment.

The oxide film 15 according to the present embodiment can be preferably formed by, for example, using a high output YAG laser and setting an output of the YAG laser to 5 W or larger to make the temperature of the semiconductor substrate 2 high in the vicinity of the first trench portion 7 in the method of forming the first trench portion 7. In this case, the thickness of the oxide film 15 is larger than that of the native oxide film formed in the other part of the semiconductor substrate 2 of the solar cell element 90, which may be, for example, approximately 3 nm to 8 nm.

In the present embodiment, the oxide film 15 is provided over the entire outer peripheral region of the second surface 2b from the end portion of the second surface 2b to the first trench portion 7. Alternatively, the oxide film 15 may be provided to a part of the outer peripheral region.

<As to Solar Cell Module>

Next, a solar cell module 21 according to an embodiment of the present invention is described with respect to FIG. 10A to FIG. 12.

Figure 10A:
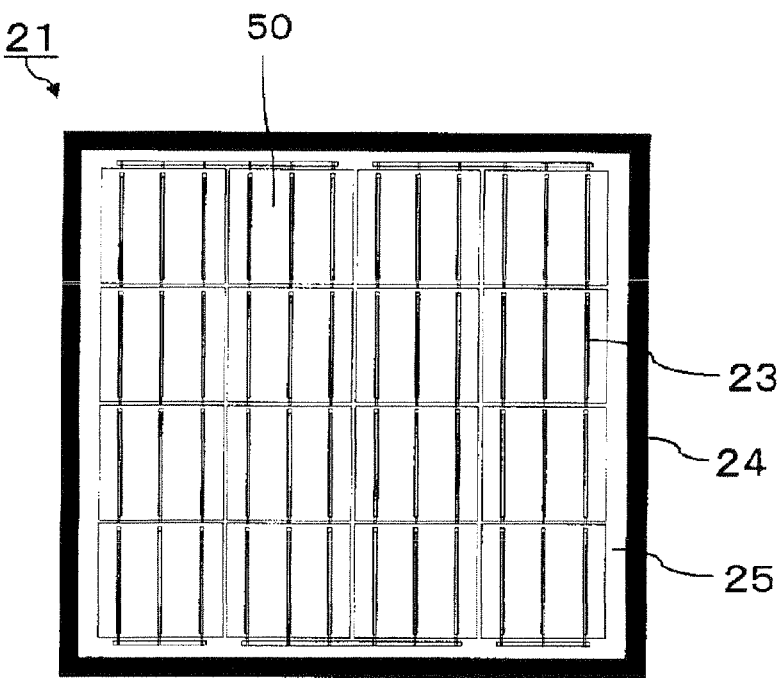
FIGS. 10A and 10B show a solar cell module 21 according to an embodiment of the present invention, where
Figure 10B:
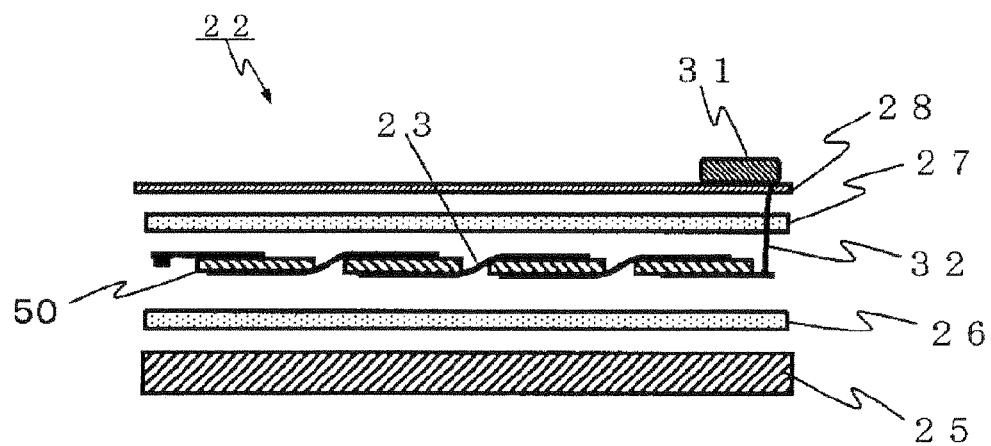

FIG. 10A is a plan view of the solar cell module 21 on a light-receiving surface side, and FIG. 10B is a schematic cross-sectional view of a solar cell panel 22, which describes the lamination state of the solar cell panel 22.

In FIGS. 10A and 10B, 23 denotes a connecting conductor, 24 denotes a module frame, 25 denotes a light-transmitting substrate, 26 denotes a light-receiving-surface side filler, 27 denotes a back-surface side filler, 28 denotes a back-surface sheet, 32 denotes an output lead from the solar cell element, and 31 denotes a terminal box.

As shown in FIG. 10A, the solar cell module 21 includes the solar cell panel 22, the module frame 24 attached to the outer peripheral portion of the solar cell panel 22, and the terminal box 31 (not shown) provided on the back surface side of the solar cell panel 22.

As shown in FIG. 10B, the solar cell panel 22 includes a plurality of solar cell elements 50, the light-receiving-surface side filler 26, the back-surface side filler 27, the light-transmitting substrate 25 and the back-surface sheet 28.

In the solar cell panel 22 according to the present embodiment, a plurality of solar cell elements 50 are connected in series. The connected plurality of solar cell elements 50 are sealed with the light-receiving-surface side filler 26 and the back-surface side filler 27. The plurality of solar cell elements 50 sealed with the fillers 26 and 27 are sandwiched between the light-transmitting substrate 25 and the back-surface sheet 28.

A plurality of solar cell elements used in the solar cell panel 22 are the solar cell elements 50 according to the embodiment described above. That is, the solar cell element 50 of the solar cell panel 22 includes the antireflection films 8, 8a and 8b provided on the first surface 2a and the side surface 2c of the semiconductor substrate 2 and in the outer peripheral portion on the second surface 2c thereof, as shown in FIG. 6B.

Accordingly, with the use of the solar cell element 50, an insulator or the like for reducing a short circuit does not need to be separately provided between the connecting conductor 23 and the solar cell element 50 in the solar cell panel 22. This enables to reduce the number of parts of the solar cell module 22 as well as simplify the manufacturing process therefor. As a result, the high output solar cell module 22 can be supplied at low cost.

This point is described below in detail.

First, the respective components of the solar cell panel 22 are described.

A substrate comprised of a glass, a polycarbonate resin or the like can be used as the light-transmitting substrate 25. As to the glass plate, a white glass, a toughened glass, a double toughened glass, a heat-reflecting glass or the like can be used. For example, a white toughened glass having a thickness of approximately 3 mm to 5 mm can be used. Meanwhile, in the case of using a substrate comprised of a synthetic resin such as a polycarbonate resin, a substrate having a thickness of approximately 5 mm can be used.

Used as the light-receiving-surface side filler 26 and the back-surface side filler 27 are fillers comprised of ethylene-vinyl acetate copolymer (hereinafter, abbreviated as EVA) or polyvinyl butyral (hereinafter, abbreviated as PVB) and then formed into a sheet-like shape having a thickness of approximately 0.4 to 1 mm by a T-die and an extruder. Those are subjected to heating and pressurizing under reduced pressure by a laminating apparatus and are softened and fused together, to thereby being integrated with other members.

EVA or PVB used for the back-surface side filler 27 may be transparent. Alternatively, one obtained by adding a titanium oxide, a pigment or the like to color in, for example, white, black or the like may be used as the EVA or PVB in accordance with an installation condition around the installation position of the solar cell module.

A pair of fluorine resin sheets having weather resistance that sandwich a sheet of aluminum foil therebetween or a polyethylene terephthalate (PET) sheet on which alumina or silica is vapor-deposited is used as the back-surface sheet 28 for preventing permeation of moisture.

Used as the output lead 32 is one obtained by coating a ribbon-like copper foil having a width of approximately 5 to 10 mm and a thickness of approximately 0.2 to 1.0 mm with a solder.

The connecting conductor 23 is soldered to the bus bar electrode 3 and the output extraction electrode 6 of the solar cell element 50, thereby serving to connect the solar cell elements 50 in series. For example, one obtained by a coating a ribbon-like copper foil having a width of approximately 1 to 3 mm and a thickness of approximately 0.1 to 0.8 mm with a solder is used.

<Method of Manufacturing Solar Cell Module>

Next, a method of manufacturing the solar cell module 21 is described.

First, the solar cell panel 22 is manufactured. Specifically, the light-receiving-surface side filler 26 is placed on the light-transmitting substrate 25, and the solar cell elements 50 to which the connecting conductors 23 and the output leads 32 are connected are further placed thereon. The back-surface side filler 27 and the back-surface sheet 28 are further placed thereon in order. After that, the output leads 32 are led to the outside of the back-surface sheet 25 using tweezers or the like from the slit directed toward the respective members on the back surface side. The laminate in the above-mentioned state is placed in a laminator and is heated at 100 to 200° C. for, for example, 15 minutes to one hour while applying a pressure under reduced pressure. This achieves the solar cell panel 22 formed of the integrally formed laminate.

Next, the terminal box 31 is attached. Specifically, the terminal box 31 is attached onto the back-surface sheet 28 to which the output leads 32 are led, with the use of a silicon-based adhesive or the like. Then, the output leads 32 on the positive side and negative side are fixed to terminals (not shown) of the terminal box 31 by soldering or the like. After that, a lid is attached to the terminal box 31.

Finally, the module frame 24 is attached to complete the solar cell module 21. Specifically, the module frame 24 comprised of aluminum or the like is attached to the outer peripheral portion of the solar cell panel 22. The module frame 24 may be attached by, for example, fixing the corner thereof with a screw or the like. The solar cell module 21 is completed in this manner.

Figure 11:
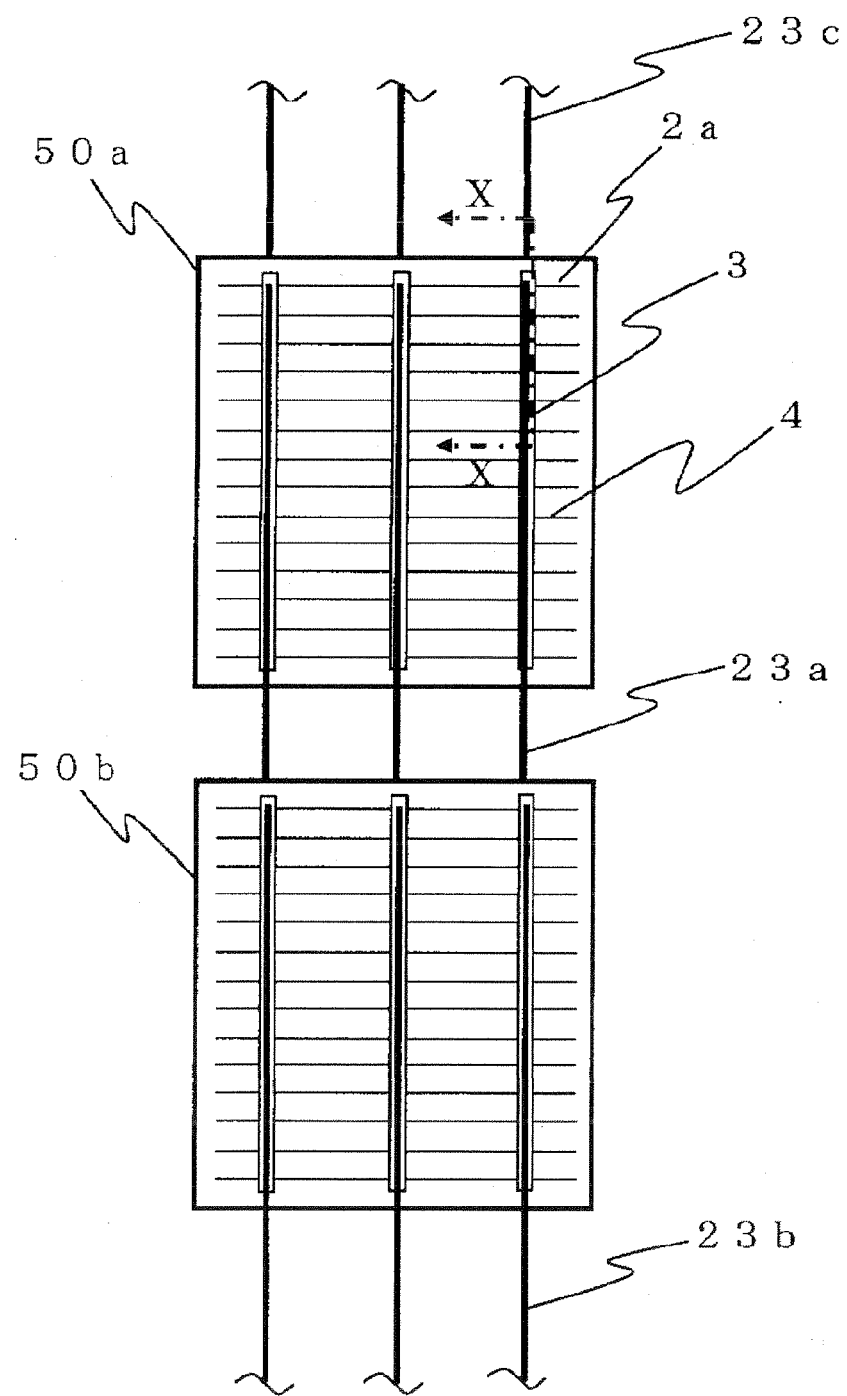
FIG. 11 is a partial plan view of the solar cell module 21, which shows the state in which adjacent solar cell elements 50a and 50b are connected.

FIG. 11 is a plan view showing the state in which two solar cell elements 50a and 50b are connected by means of the connecting conductors 23 in the achieved solar cell module 21.

As shown in FIG. 11, a connecting conductor 23a is connected to the bus bar electrode 3 on the first surface 2a of the solar cell element 50a by soldering. Then, the connecting conductor 23a is soldered to the output extraction electrode 6 on the second surface 2b of the solar cell element 50b disposed to be adjacent to the solar cell element 50a. Accordingly, two adjacent solar cell elements 50a and 50b are connected in series by means of the connecting conductor 23a.

A connecting conductor 23b is connected to the bus bar electrode 3 of the solar cell element 50b by soldering. Then, the connecting conductor 23b is soldered to the output extraction electrode 6 of a subsequent solar cell element 50 (not shown). A plurality of solar cell elements 50 are connected in series to each other in this manner.

FIG. 12 is a partial cross-sectional view of the solar cell module 21 taken along a line X-X of FIG. 11. The state in which a connecting conductor 23c is soldered to the output extraction electrode 6 of the solar cell element 50a in the solar cell module 21 is described with respect to FIG. 12.

As shown in FIG. 12, the connecting conductor 23c soldered to the output extraction electrode 6 on the second surface 2b of the solar cell element 50a extends obliquely upward toward the bus bar electrode 3 on the first surface 2a of the adjacent solar cell element 50. Further, owing to the pressurization by lamination as described above when a solar cell panel is manufactured, the connecting conductor 23c is brought into contact with the solar cell element 50 at a contact portion G in the vicinity of the corner portion of the solar cell element 50. That is, the connecting conductor 23c abuts on the intersection of the second surface 2b positioned on the outer peripheral portion with respect to the first trench portion 7 and the side surface 2c or against the portion in the vicinity thereof.

In the above-mentioned configuration, the solar cell element 50 of the solar cell module 21 according to the present embodiment includes the antireflection films 8a and 8b positioned on the side surface 2c thereof and the outer peripheral portion of the second surface 2b thereof, respectively, as described above. Accordingly, at the contact portion G, the connecting conductor 23c abuts on the solar cell element 50 through the antireflection films 8a and 8b. For example, an insulating film or a high-resistance film such as a silicon nitride film is used for the antireflection films 8, 8a and 8b.

In the present embodiment, the connecting conductor 23c abuts on the solar cell element 50 at the contact portion G through the above-mentioned antireflection films 8, 8a and 8b as described above. This stabilizes the fixation of the connecting conductor 23c and also enables to bend the connecting conductor 23c obliquely upward from the intersection of the solar cell element 50 at a large angle. Accordingly, the connecting conductor 23c can be stably fixed to the portion in the vicinity of the side surface of the solar cell element 50. This allows the light incident upon a part of the connecting conductor 23c between the solar cell elements 50 to be reflected to the side surface 2c of the solar cell element 50 more efficiently, leading to an increase in photocurrent. This enables to suppress a positive-side output and a negative-side output of the solar cell element 50 from becoming short-circuited at the contact portion G by the connecting conductor 23c. As a result, it is possible to provide the solar cell module 21 having high reliability as well as high output at low cost.

Further, the connecting conductor 23c can be stably fixed to the portion in the vicinity of the side surface 2c of the solar cell element 50 as described above, which enhances the efficiency of disposing the solar cell elements 50 in the solar cell module 21. This also improves the output of the solar cell module 21.

As in the present embodiment, in the case where the solar cell module 21 includes the contact portion G at which the connecting conductor 23 abuts on the solar cell element, the solar cell element 70 shown in FIGS. 7A and 7B may be used. In the case where the solar cell element 70 is used, a large distance can be secured from the contact portion G to the first trench portion 7. This enables to, in a laminating step in the manufacture process for the solar cell module 21, reduce an occurrence of a crack in the vicinity of the first trench portion 7 even in a case where a stress is applied to the contact portion G. As a result, the solar cell module 21 having high reliability can be provided.

Next, a solar cell element X according to a tenth embodiment of the present invention is described in detail with respect to the drawings.

Figure 13A:
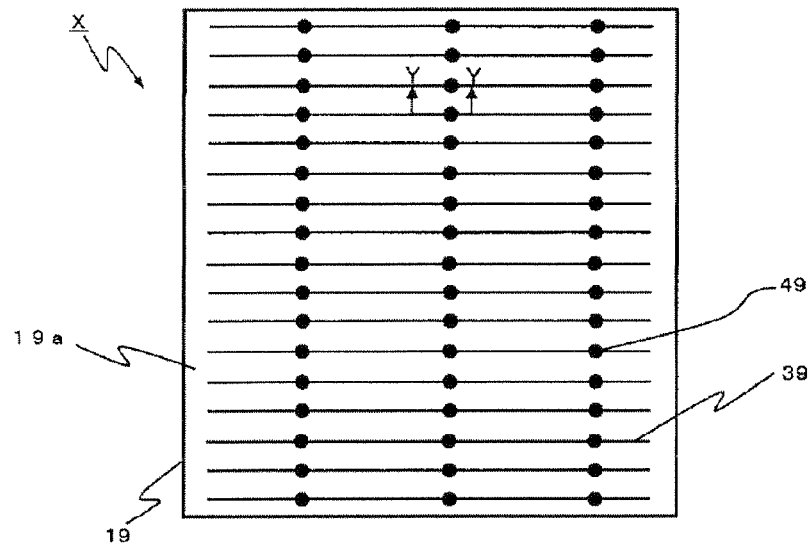
FIGS. 13A and 13B show a solar cell element X according to another embodiment of the present invention, where FIG.
Figure 13B:
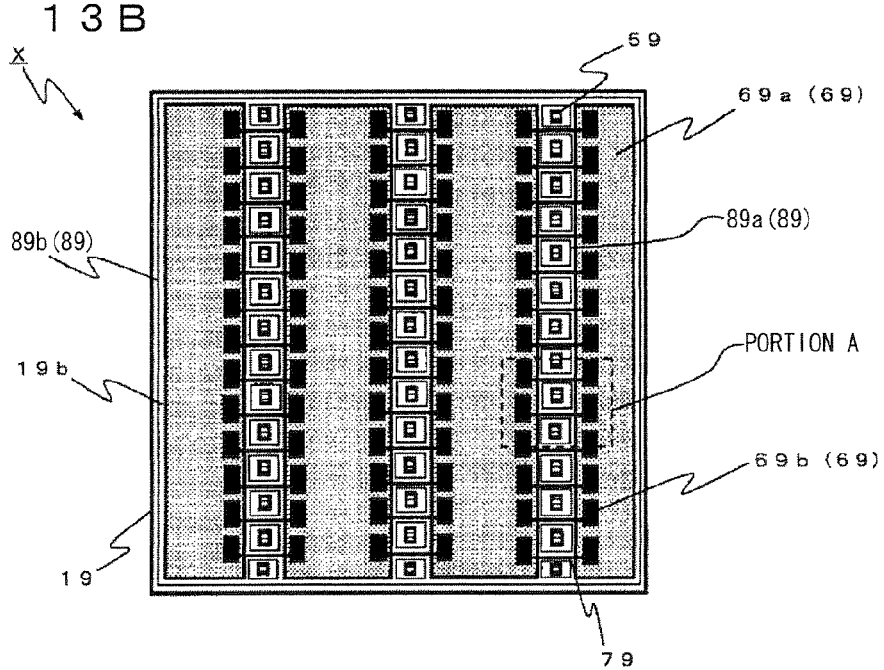

The solar cell element X according to one embodiment of the present invention is a so-called back contact solar cell element as shown in FIGS. 13A and 13B. That is, the solar cell element X includes a semiconductor substrate 19, a semiconductor layer 29, surface electrodes 39, through-electrodes 49, second electrodes 59 formed on the back surface (second surface) of the semiconductor substrate 19, first electrodes 69 and third electrodes (connecting electrodes) 79.

The semiconductor substrate 19 includes a first surface 19a that mainly receives sunlight and a second surface 19b corresponding to the back surface of the first surface 19a. The semiconductor substrate 19 has one conductivity type, for example, p-type. Examples of the above-mentioned semiconductor substrate 19 include single-crystal and poly-crystal silicon substrates.

Figure 14:
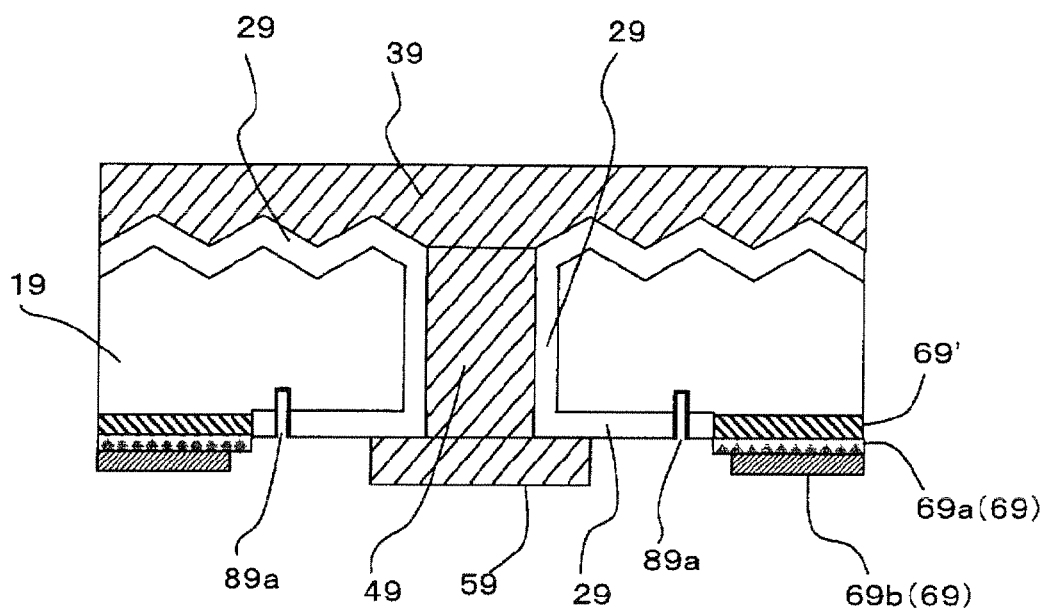
FIG. 14 is a view for describing a cross section in a direction Y-Y of FIG. 13A.

The semiconductor layer 29 has an opposite conductivity type to that of the semiconductor substrate 19 and, as shown in FIG. 14, is formed on the first surface 19a of the semiconductor substrate 19, the surface of a through-hole of the semiconductor substrate 19 and a part of the second surface 19b of the semiconductor substrate 19. The semiconductor layer 29 forms a pn junction at the interface with the semiconductor substrate 19. Accordingly, the semiconductor layer 29 is an n-type when the semiconductor substrate 19 is a p-type, and is a p-type when the semiconductor substrate 19 is an n-type. When the semiconductor substrate 19 is a p-type, the semiconductor layer 29 can be formed by, for example, diffusing n-type impurities such as phosphorous into a desired position of the semiconductor substrate 19 by the vapor-phase diffusion method, screen printing method or the like.

As shown in FIG. 13B, the region provided over the outer peripheral portion of the second surface 19b of the pn junction region provided on the second surface 19b is the first pn junction region. Meanwhile, as shown in FIG. 13B, the region provided on the inner side with respect to the first pn junction region of the pn junction region provided on the second surface 19b is a second pn junction region. As shown in FIG. 14B, the second electrodes 59 are disposed on a part of the second pn junction region.

The surface electrodes 39 are formed on the semiconductor layer 29 located on the first surface 19a of the semiconductor substrate 19 and serve to collect the carriers (for example, electrons) generated in the semiconductor substrate 19. The shape of the surface electrode 39 is not particularly limited, but in terms of increasing a power generation region of the light-receiving surface, it is preferably a shape comprised of a plurality of thin lines as shown in FIG. 13A. The above-mentioned surface electrode 39 is comprised of a conductive metal such as silver or copper, and can be formed by application of a conductive paste including the metal by the screen printing method or the like and firing the conductive paste.

The through-electrode 49 serves to guide the carriers collected by the surface electrode 39 to the second electrode 59 formed on the second surface 19b of the semiconductor substrate 19. That is, the through-electrode 49 is formed so as to penetrate the semiconductor substrate 19 from the first surface 19a to the second surface 19b of the semiconductor substrate 19 and is electrically connected to the surface electrode 39 and the second electrode 59. Further, as shown in FIG. 13A, a plurality of through-electrodes 49 are provided for one surface electrode 39, whereby the density of the photocurrent of one through-electrode 49 can be made small, leading to a reduction of resistance components of the solar cell element. The above-mentioned through-electrode 49 is formed by filling a conductive paste containing silver, copper or the like into a through-hole preliminarily obtained by drilling the semiconductor substrate 19 with, for example, a laser and firing the conductive paste.

The second electrodes 59 are formed on the semiconductor layer 29 located on the second surface 19b of the semiconductor substrate 19, and serve to collect the carriers generated in the pn junction on the second surface 19b side and collect the carriers obtained through the through-electrodes 49. That is, the second electrode 59 has the same polarity as those of the surface electrode 39 and the through-electrode 49, which is negative when the semiconductor substrate 19 is a p-type and the semiconductor layer 29 is an n-type. It suffices that the second electrode 59 is shaped so as to be electrically connected to the through-electrode 49 and is insulated from first and third electrodes described below. For example, as shown in FIG. 13B, the second electrodes 59 have a rectangular shape so as to be spaced from each other directly below the respective through-electrodes 49. Alternatively, in the case where the third electrode 79 is not formed in the manner shown in FIG. 13B the second electrode 59 may be the elongated first electrode capable of being connected to each through-electrode 49. The same material and formation method as those of the surface electrode 39 can be used for the second electrode 59.

The first electrode 69 is disposed in the region in which the semiconductor layer 29 is not formed (non-forming portion) on the second surface 19b of the semiconductor substrate 19. The first electrode 69 has a polarity different from that of the second electrode 59. Therefore, for example, when the solar cell element X is formed of the p-type semiconductor substrate 19 and the n-type semiconductor layer 29, the second electrode 59 is negative and the first electrode 69 is positive. For this reason, the first electrode 69 is disposed to as to be electrically isolated from the second electrode 59.

The first electrode 69 includes a collector portion 69a and an output extraction portion 69b.

The collector portion 69a is bonded through a high-concentration doped layer 69' formed at the interface with the semiconductor substrate 19 and serves to collect the carriers (for example, holes) generated in the semiconductor substrate 19. Accordingly, the carriers generated in the semiconductor substrate 19 are collected with efficiency. Here, high concentration refers to that the impurity concentration is larger than the concentration of impurities of one conductivity type in the semiconductor substrate 19. The above-mentioned collector portion 69a can be formed by applying a conductive paste mainly containing aluminum or the like onto a desired position of the semiconductor substrate 19 by, for example, the screen printing method and then firing the conductive paste. In this case, if the semiconductor substrate 19 is comprised of a silicon substrate and the collector portion 69a is comprised of a metal mainly containing aluminum, a high-concentration doped layer 69' is formed simultaneously by firing a conductive paste mainly containing aluminum.

The output extraction portion 69b serves to output the carriers collected by the collector portion 69a to the outside. The position of the output extraction portion 69b is not particularly limited as long as the output extraction portion 69b is electrically connected to the collector portion 69a, for example, the output extraction portion 69b may be formed on the collector portion 69a as shown in FIG. 13B. The same material and formation method of the surface electrode 39 can be used for the above-mentioned output extraction portion 69b.

In the present embodiment, the collector portion 69a includes paired electrodes that form a pair with the second electrode 59 being sandwiched therebetween when the second surface 19b of the semiconductor substrate 19 is viewed in plan view. The pair of collector portions 69a are electrically connected through the third electrode 79. The third electrode 79 has the same polarity as that of the first electrode 69 (collector portion 69a) and is disposed so as to be electrically isolated from the second electrode 59 having a different polarity. The third electrode 79 assists the collection of carriers by electrically connecting a pair of collector portions 69b.

Further, as shown in FIGS. 13A and 13B and FIG. 14, a trench portion 89 obtained by removing a part of the semiconductor layer 29 is formed in the solar cell element X for achieving pn isolation. Specifically, a second trench portion 89a is formed so as to surround the second electrode 59 on the second surface 19b of the semiconductor substrate 19. Moreover, a first trench portion 89b is formed at a position spaced from the outer peripheral portion by a given distance along the outer periphery of the semiconductor substrate 19.

As shown in FIG. 14, pn isolation can be obtained more reliably by the trench portion 89 formed up to a deeper position that is larger than the thickness of the semiconductor layer 29. The trench portion 89 can be formed with a laser or the like.

Figure 15A:
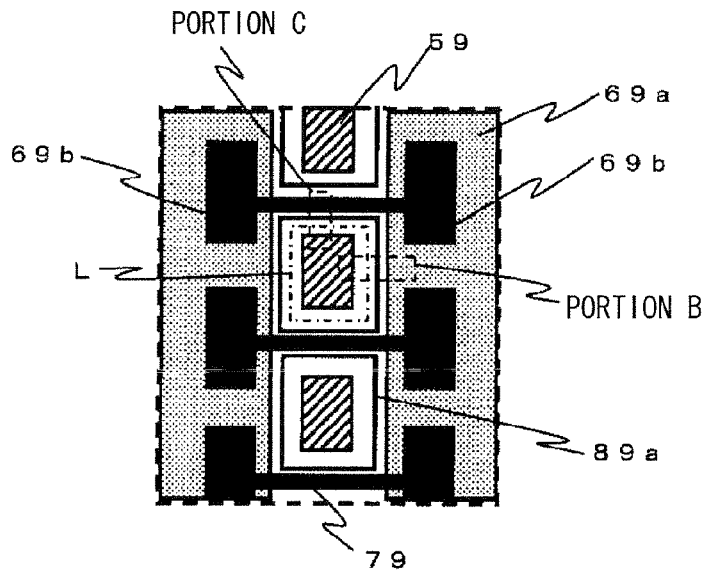
FIG. 15A is an enlarged view of a portion A of FIG. 13A.
Figure 15B:
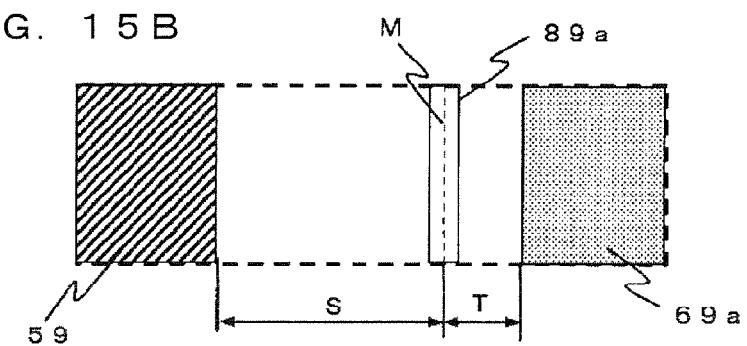
FIG. 15B is a view schematically showing a shortest distance S and a shortest distance T with an enlarged view of a portion B of FIG. 15A.
Figure 15C:
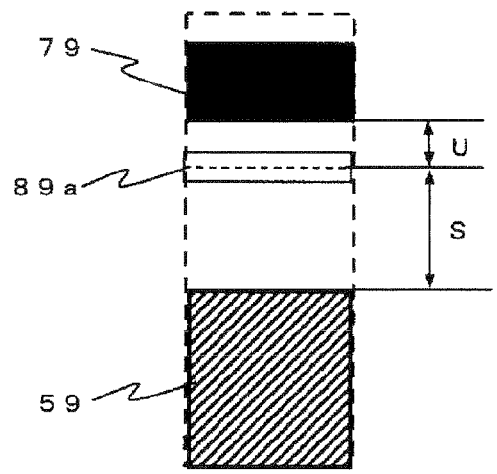
FIG. 15C is a view schematically showing the shortest distance S and a shortest distance U with an enlarged view of a portion C of FIG. 15A.

Next, the second trench portion 89*a* is described in detail with respect to FIGS. 15A to 15C.

In the present embodiment, as shown in FIGS. 15A and 15B, the second trench portion 89*a* is formed at a position at which a shortest distance T between the first electrode 69 and the second trench portion 89*a* is smaller than a shortest distance S between the second electrode 59 and the second trench portion 89*a* when viewed from the second surface 1*b* of the semiconductor substrate 19. In FIG. 15A, a chain line L that links parts located at a middle position between the second electrode 59 and the first electrode 69 is described and the second trench portion 89*a* is formed on the side closer to the first electrode 69 with respect to the chain line L in this figure. FIG. 15B schematically shows the above-mentioned shortest distances S and T with the use of a partially enlarged view of a portion B of FIG. 15A. Here, the shortest distance refers to the shortest distance among the distances from an imaginary center line M (in this figure, shown by a dotted line) of the second trench portion 89*a* to the end portion of the first and second electrodes 69 and 59.

Next, the action depending on the formation position of the second trench portion 89*a* is described in detail.

Figure 16:
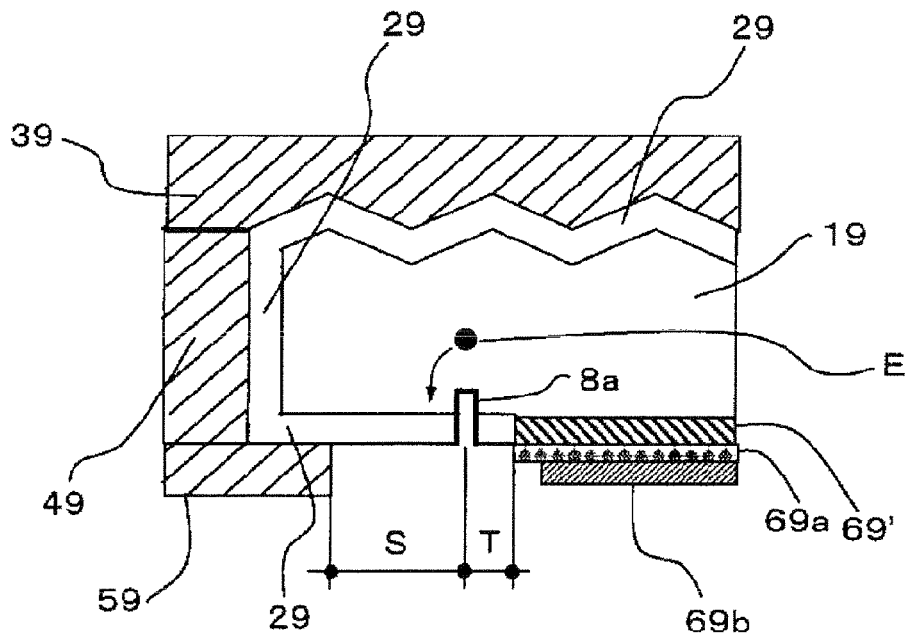
FIG. 16 is a view for describing a movement of a minority carrier.

FIG. 16 schematically shows the movement of the minority carrier E generated in the semiconductor substrate 19 when the solar cell element X receives sunlight. As in the present embodiment, in the case where the second trench portion 89*a* is formed at the position at which the shortest distance T between the first electrode 69 and the second trench portion 89*a* is smaller than the shortest distance S between the second electrode 59 and the second trench portion 89*a*, the moving distance of the minority carrier E to the semiconductor layer 29 to which the second electrode 59 is bonded is short as shown in FIG. 16. This reduces the rate at which the minority carrier E disappears due to recombination, leading to improvements of photoelectric conversion efficiency of a solar cell element through efficient extraction of carriers.

FIG. 15C is a partially enlarged view of a portion C of FIG. 15A. As shown in FIG. 15C, in the case where there is provided the third electrode 79 electrically connected to a pair of first electrodes 69 as in the present embodiment, it suffices that the second trench portion 89*a* is formed at a position at which a shortest distance U between the third electrode 79 and the second trench portion 89*a* is smaller than the shortest distance S between the second electrode 59 and the second trench portion 89*a* when viewed from the second surface 19*b* of the semiconductor substrate 19. According to such a manner, the third electrode 79 has the same polarity as that of the first electrode 69 as described above, whereby the photoelectric conversion efficiency can be enhanced by reducing the moving distance of the minority carrier E similarly to the first electrode 69.

In the present embodiment, the second trench portion 89*a* is formed at a position at which the relationship of the above-mentioned shortest distances S, T and U from the first and second electrodes 69 and 59 is maintained, with a space from the first electrode 69. In the case where the thus disposed second trench portion 89*a* is formed by irradiating the semiconductor substrate 19 comprised of a silicon substrate with a laser, it is possible to reduce the accumulation of dust of silicon oxide or the like, which is generated as a result of laser irradiation, on the first electrode 69. As a result, in the present embodiment, the connecting conductor or the like can be easily bonded to the first electrode 69 by a solder in the following process.

Next, a solar cell element Y according to an eleventh embodiment of the present invention is described.

Figure 17:
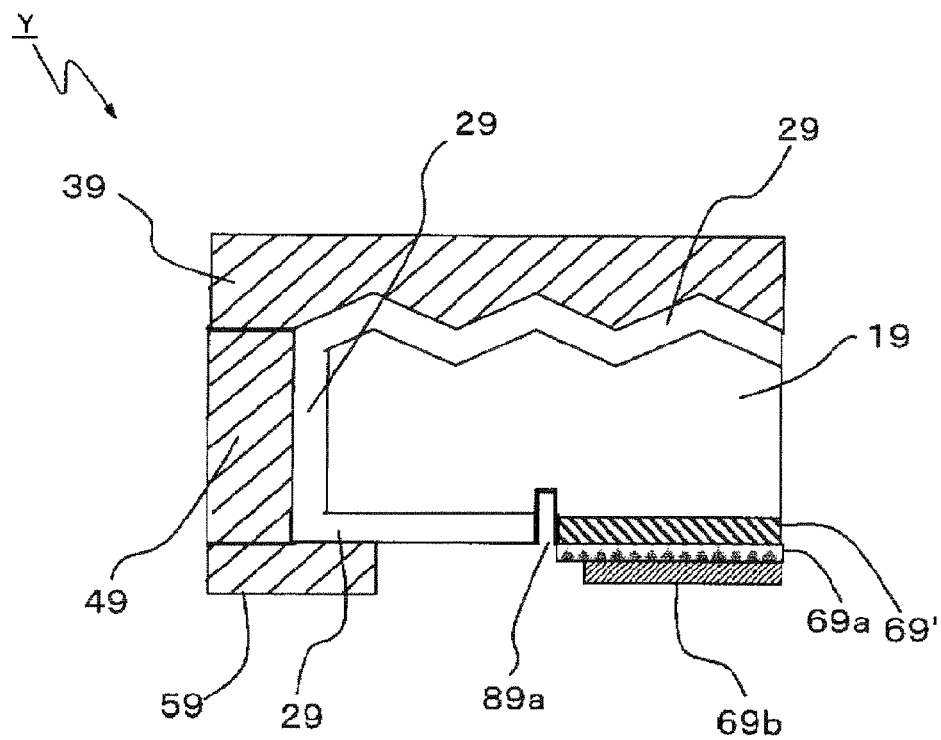
FIG. 17 is a partially enlarged view showing a solar cell element Y according to another embodiment of the present invention.

In the present embodiment, as shown in FIG. 17, the first electrode 69 (collector portion 69*a*) has an end surface along the arrangement direction (formation direction) of the second trench portion 89*a*, which is different from the embodiment shown in FIG. 14 in that the end surface is coplanar with the inner surface of the second trench portion 89*a*. That is, in the present embodiment, the second trench portion 89*a* is formed along the first electrode 69 to be in contact with the first electrode 69. Therefore, the distance between the second trench portion 89*a* and the first electrode 69 becomes zero in the present embodiment. Compared with the embodiments described above, the moving distance of the minority carrier E can be reduced further in this manner, which further enhances the photoelectric conversion efficiency.

Next, the method of manufacturing the solar cell element X according to the tenth embodiment is described.

<Step of Preparing Semiconductor Substrate>

First, a p-type silicon substrate doped with, for example, boron is prepared as the semiconductor substrate 19 having one conductivity type. It suffices that a silicon substrate comprised of a single-crystal silicon substrate or a poly-crystal silicon substrate that is cut from a silicon ingot is used as the above-mentioned silicon substrate, and that the silicon substrate has a square or rectangular shape with sides of approximately 140 to 180 mm and a thickness of approximately 150 μm to 300 μm.

<Step of Forming Through-Hole>

Next, a through-hole is formed between the first surface 19*a* and the second surface 19*b* of the semiconductor substrate 19. The through-hole is formed, for example, from the second surface 19*b* side toward the first surface 19*a* side of the semiconductor substrate 19 with a mechanical drill, water jet, laser device or the like. In particular, a YAG (yttrium.aluminum.garnet) laser, $YVO_4$ (yttrium.vanadate) laser or the like is preferably used for preventing an occurrence of a microcrack when or after a through-hole is formed.

As shown in FIG. 13B, the region provided over the outer peripheral portion of the second surface 19*b* of the pn junction region provided on the second surface 19*b* is the first pn junction region. Meanwhile, as shown in FIG. 13B, the region provided on the inner side with respect to the first pn junction region of the pn junction region provided on the second surface 19*b* is a second pn junction region. As shown in FIG. 14, the second electrodes 59 are disposed on a part of the second pn junction region.

<Step of Forming Uneven Structure>

Next, an uneven structure including minute projections (protrusions) for effectively reducing the optical reflectance is formed on the first surface 19*a* of the semiconductor substrate 19. As the method of forming an uneven structure, the wet etching method with an alkaline solution or the dry etching method with an etching gas can be used.

<Step of Forming Semiconductor Layer>

Next, the semiconductor layer 29 is formed on the first surface 19*a* of the semiconductor substrate 19, the inner surface of the through-hole and the second surface 19*b*. Phosphorous (P) is used as an n-type doping element having a conductivity type opposite to that of the semiconductor substrate 19, which is $n^+$ type having a sheet resistance of approximately 60 to 300Ω/□. Accordingly, the pn junction is formed between the p-type region of the above-mentioned semiconductor substrate 19 and the semiconductor layer 29. Further, the vapor-phase diffusion method is used in diffusion of a doping element to the semiconductor substrate 19, with the result that the semiconductor layer 29 can be formed simultaneously on the first surface and second surface of the semiconductor substrate 19 and the inner surface of the through-hole.

<Step 1 of pn Isolation>

In the case where the semiconductor layer 29 is formed by the above-mentioned vapor-phase diffusion method, the semiconductor layer 29 is formed not only on the first surface and second surface of the semiconductor substrate 19 but also on the side surface of the semiconductor substrate 19, and thus the first surface 19a of the semiconductor substrate 19 and a part of the semiconductor layer 29 of the second surface 19b are isolated (pn-isolated). In the pn isolation, the blasting method in which powders of silicon oxide or alumina are sprayed only onto the portion in the vicinity of the second surface 19b at high pressure and the semiconductor layer 29 in the vicinity of the second surface 19b is shaved off or laser processing method is used, to thereby form the first trench portion 89b at the end portion in the vicinity of the second surface 19b.

<Step of Forming Surface Electrode and Through-Electrode>

Next, the surface electrodes 39 and the through-electrodes 49 are formed in the semiconductor substrate 19. Those electrodes are obtained by applying a conductive paste comprised of silver, copper or the like onto the first surface 19a of the semiconductor substrate 19 by the application method such as the screen printing method. In this case, the conductive paste is filled into the through-hole of the semiconductor substrate 19. After that, the conductive paste is fired at a maximum temperature of 500 to 850° C. for several tens of seconds to several tens of minutes, to thereby form the surface electrodes 39 and the through-electrodes 49.

<Step of Forming First to Third Electrodes>

Next, the first to third electrodes are formed on the second surface 19b of the semiconductor substrate 19. First, a conductive paste comprised of aluminum or the like is applied onto the second surface 19b of the semiconductor substrate 19, which forms the collector portion 69a of the first electrode 69, into a predetermined shape using the screen printing method, and the conductive paste is fired at a maximum temperature of 500 to 850° C. for several tens of seconds to several tens of minutes, to thereby form the collector portion 69a. The high-concentration doped layer 69' is formed simultaneously with the formation of the collector portion 69a.

Next, the second electrodes 59, the output extraction portions 69b of the first electrodes 69 and the third electrodes 79 are formed. First, a conductive paste comprised of silver, copper or the like is applied onto the positions at which those electrodes are formed using the application method such as the screen printing method. After that, the conductive paste is fired at a maximum temperature of 500 to 850° C. for several tens of seconds to several tens of minutes, to thereby form various electrodes.

<Step 2 of pn Isolation>

Next, pn isolation is performed in the parts around the second electrodes 59. Laser light is irradiated to the parts between the second electrode 59 and the first electrode 69 (collector portion 69a) and between the second electrode 59 and the third electrode 79 in the semiconductor substrate 19, in which the semiconductor layer 29 is formed, with a YAG laser (having a wavelength of 1,064 nm), second harmonic generation (SHG)-YAG laser (having a wavelength of 532 nm) or the like, to thereby form the second trench portion 89a in a rectangular shape. On this occasion, the positional relationships between the second trench portion 89a and the first to third electrodes 69, 59 and 79 satisfy the above-mentioned relationships of shortest distances S, T and U.

On this occasion, the leakage current of the solar cell element can be made small if the width of the second trench portion 89a is 20 μm or larger and 50 μm or smaller. Alternatively, in the case where the second trench portion 89a is formed with a laser, a laser pulse is irradiated while, for example, moving a predetermined position on the surface of the semiconductor substrate 19 to which a laser is irradiated by a galvanometer minor or moving the work table on which the semiconductor substrate 19 is placed at a constant speed by a servo motor controlled by a sequencer or the like. In this method, the leakage current of the solar cell element can be further reduced if the overlap ratio of the processed circle formed by the next laser pulse irradiation to the processed circle formed by one laser (one pulse) irradiation is approximately 20% or larger and 60% or smaller.

While the embodiments according to the present invention have been shown and described, the present invention is not limited to those embodiments described above. It is therefore understood that numerous modifications and variations can be devised without departing from the scope of the invention.

DESCRIPTION OF REFERENCE SYMBOLS

1; solar cell element
2; semiconductor substrate
2a; first surface
2b; second surface
2b1; outer peripheral portion of second surface
2c; side surface
3; bus bar electrode
4; finger electrode
5; collector electrode (first electrode)
6; output extraction electrode
7; first trench portion
8; antireflection film on first surface
8a; antireflection film provided on side surface
8b; antireflection film provided on outer peripheral portion of second surface
8c; antireflection film provided on inner peripheral surface of first trench portion
9; n-layer
10; bulk region
11; end portion of collector electrode (first electrode)
12; center line in width direction of first trench portion
13; pn junction of side surface
20, 30, 40, 50, 60, 70; solar cell element
21; solar cell module
22: solar cell panel
23; connecting conductor
24; module frame
25; light-transmitting substrate
26; light-receiving-surface side filler
27; back-surface side filler
28; back-surface sheet
31; terminal box
32; output lead
E; minority carrier generated in bulk region
Q; shortest distance between end portion of collector electrode and center line in width direction of first trench portion
P; shortest distance between pn junction on side surface and center line in width direction of first trench portion
G; contact portion

The invention claimed is:

1. A solar cell element, comprising:
a semiconductor substrate that comprises a semiconductor region of one conductivity type and a layer of an opposite conductivity type to the one conductivity type with a first surface serving as a light-receiving surface, a second surface located on a back side of the first surface, and a side surface connecting the first surface and the second surface, in which over a surface on the first surface side, a surface on the side surface side, and a surface of an outer peripheral portion on the second surface side of the semiconductor region of the one conductivity type, the layer of the opposite conductivity type to the one conductivity type is formed such that a first pn junction region is provided along the respective surfaces of the first surface, the side surface, and the outer peripheral portion of the second surface and in which a high-concentration doped layer having higher concentration of impurities of the one conductivity type than the semiconductor region is further formed on a surface that is not the outer peripheral portion on the second surface side of the semiconductor region;

a first electrode of the one conductivity type located on the high-concentration doped layer of the second surface so as to be adjacent to the first pn junction region, wherein the semiconductor substrate includes a first trench portion located between the outer periphery of the second surface and an end portion of the first electrode and spaced from the first electrode and the high-concentration doped layer and configured to isolate the first pn junction region on the second surface along the outer periphery of the second surface, and wherein, when viewed from the second surface side in plan view, a shortest distance Q between the end portion of the first electrode and the first trench portion is smaller than a shortest distance P between a pn junction of the first pn junction region of the side surface side and the first trench portion: and at least one of a first bump and a second bump, the first bump located at an intersection of an inner peripheral surface of the first trench portion and a portion of the second surface on an outer side with respect to the first trench portion, the second bump located at an intersection of the inner peripheral surface of the first trench portion and a portion of the second surface on an inner side with respect to the first trench portion, wherein the first bump and the second bump project in a normal direction of the second surface on the second surface.

2. A solar cell element comprising:

a semiconductor substrate that comprises a semiconductor region of one conductivity type and a layer of an opposite conductivity type to the one conductivity type with a first surface serving as a light-receiving surface, a second surface located on a back side of the first surface, and a side surface connecting the first surface and the second surface, in which over a surface on the first surface side, a surface on the side surface side, and a surface of an outer peripheral portion on the second surface side of the semiconductor region of the one conductivity type, the layer of the opposite conductivity type to the one conductivity type is formed such that a first pn junction region is provided along the respective surfaces of the first surface, the side surface, and the outer peripheral portion of the second surface;

a first electrode of the one conductivity type located on the second surface so as to be adjacent to the first pn junction region, wherein the semiconductor substrate includes a first trench portion located between the outer periphery of the second surface and an end portion of the first electrode with a spacing from the first electrode and configured to isolate the first pn junction region on the second surface along the outer periphery of the second surface, and wherein, when viewed from the second surface side in plan view, a shortest distance Q between the end portion of the first electrode and the first trench portion is smaller than a shortest distance P between a pn junction of the first pn junction region of the side surface side and the first trench portion; and at least one of a first bump and a second bump, the first bump located at an intersection of an inner peripheral surface of the first trench portion and a portion of the second surface on an outer side with respect to the first trench portion, the second bump located at an intersection of the inner peripheral surface of the first trench portion and a portion of the second surface on an inner side with respect to the first trench portion, wherein the first bump and the second bump project in a normal direction of the second surface on the second surface.

3. The solar cell element according to claim 2, wherein the first bump and the second bump are provided on the second surface, the first bump having a height equal to or smaller than a height of the second bump.

4. The solar cell element according to claim 2, wherein an oxide film is formed on at least one of the first bump and the second bump.

5. The solar cell element according to claim 2, wherein an oxide film is formed between the outer periphery of the second surface and the first trench portion on the second surface.

6. The solar cell element according to claim 2, further comprising an antireflection film located on the first surface and the side surface.

7. The solar cell element according to claim 6, wherein the antireflection film is provided also in the outer peripheral region of the second surface from the side surface to the first trench portion.

8. The solar cell element according to claim 7, wherein the antireflection film is provided also on an inner peripheral surface of the first trench portion.

9. The solar cell element according to claim 2, wherein:

the semiconductor substrate comprises a second pn junction region located on an inner side with respect to the first pn junction region on the surface on the second surface side of the semiconductor region of the one conductivity type;

the solar cell element further comprises a second electrode located on a layer of the opposite conductivity type that forms a part of the second pn junction region;

the semiconductor substrate further includes a second trench portion configured to isolate the second pn junction region between the first electrode and second electrode so as to surround the second electrode when viewed from the second surface side in plan view; and when viewed from the second surface side in plan view, a shortest distance T between the first electrode and the second trench portion is smaller than a shortest distance S between the second electrode and the second trench portion.

10. The solar cell element according to claim 9, wherein:

the first electrode further comprises:

paired electrodes located so as to sandwich the second electrode; and a connecting electrode electrically connecting the paired electrodes; and when viewed from the second surface side in plan view, a shortest distance U between the connecting electrode and the second trench portion is smaller than the shortest distance S between the second electrode and the second trench portion.

11. The solar cell element according to claim 9, wherein the first electrode is disposed so as to be spaced from the second trench portion.

12. The solar cell element according to claim 2, wherein the first trench portion comprises a curved portion from a bottom to an inner side surface in a cross-sectional shape perpendicular to the second surface.

13. A solar cell module comprising a plurality of the solar cell elements according to claim 1.

14. A solar cell module comprising a plurality of the solar cell elements according to claim 2.

15. A solar cell module comprising a plurality of the solar cell elements according to claim 5.

* * * * *